(12) United States Patent
Suzuki

(10) Patent No.: US 7,638,792 B2
(45) Date of Patent: Dec. 29, 2009

(54) TUNNEL JUNCTION LIGHT EMITTING DEVICE

(75) Inventor: Naofumi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 161 days.

(21) Appl. No.: 11/909,229

(22) PCT Filed: Mar. 15, 2006

(86) PCT No.: PCT/JP2006/305094

§ 371 (c)(1),
(2), (4) Date: Sep. 20, 2007

(87) PCT Pub. No.: WO2006/100975

PCT Pub. Date: Sep. 28, 2006

(65) Prior Publication Data

US 2009/0014712 A1    Jan. 15, 2009

(30) Foreign Application Priority Data

Mar. 23, 2005    (JP) .............................. 2005-083308

(51) Int. Cl.
*H01L 21/00* (2006.01)
(52) U.S. Cl. .......................... 257/25; 257/94; 257/103
(58) Field of Classification Search .................. 257/25, 257/94, 103
See application file for complete search history.

(56) References Cited

U.S. PATENT DOCUMENTS

| | | | | |
|---|---|---|---|---|
| 5,900,650 A | * | 5/1999 | Nitta | 257/94 |
| 7,123,638 B2 | * | 10/2006 | Leary et al. | 372/43.01 |
| 2004/0217343 A1 | * | 11/2004 | Chang et al. | 257/25 |
| 2005/0083979 A1 | * | 4/2005 | Leary et al. | 372/43 |

FOREIGN PATENT DOCUMENTS

| | | |
|---|---|---|
| JP | 2002-134835 A | 5/2002 |
| JP | 2003-518326 A | 6/2003 |
| JP | 2003-198045 A | 7/2003 |
| JP | 2004-235408 A | 8/2004 |
| JP | 2004-247563 A | 9/2004 |
| JP | 2004-336039 A | 11/2004 |

\* cited by examiner

*Primary Examiner*—Long Pham
(74) *Attorney, Agent, or Firm*—Sughrue Mion, PLLC

(57) ABSTRACT

A tunnel junction light emitting device according to the present invention is provided with an active layer and an electron tunneling region supplying the active layer with carriers. The electron tunneling region has a first p-type semiconductor layer, a second p-type semiconductor layer and an n-type semiconductor layer. The second p-type semiconductor layer is sandwiched between the first p-type semiconductor layer and the n-type semiconductor layer, and the first p-type semiconductor layer, the second p-type semiconductor layer and the n-type semiconductor layer form a tunnel junction to which a reverse bias is applied. An energy level at a valence band edge of the second p-type semiconductor layer is equal to or lower than an energy level at a valence band edge of the first p-type semiconductor layer.

19 Claims, 19 Drawing Sheets

TUNNEL JUNCTION LIGHT EMITTING DEVICE

TECHNICAL FIELD

The present invention relates to a light emitting device using compound semiconductors in a field of an optical communication, an optical interconnection and the like. In particular, the present invention relates to a tunnel junction light emitting device having a tunnel junction.

BACKGROUND ART

An optical communication that is capable of a long distance and bulk transfer is known. Particularly in a long distance communication, lots of optical communication techniques have been put to practical use. In general, a semiconductor laser is used as a light source in a transmitting device of the optical communication. With regard to the semiconductor laser, low electrical resistance is preferable. It is because increase in power consumption and heat generation cause deterioration of device characteristics and device lifetime, and may possibly cause deterioration of modulation rate. Especially with regard to a vertical cavity surface emitting laser (VCSEL), areas of an electrode and an active layer are small and thus the resistance and thermal resistance are high. The heat generated by those resistances has a significant impact, which causes the output and the modulation rate to be limited. For this reason, a technique that can keep the electric resistance low is particularly important with regard to the vertical cavity surface emitting laser. On the other hand, with regard to a semiconductor laser such as a pump laser having a long cavity length, its resistance is comparatively small while its operation current is large. This also leads to increase in heat generation and hence causes output saturation. Therefore, a technique that can further reduce the resistance is desired with regard to the pump laser as well.

To increase an area through which current flows is effective for lowering the resistance. Therefore, lowering of the resistance has been tried by increasing a current confinement width or an active layer stripe width. In the case of the vertical cavity surface emitting laser, however, the increase in the current confinement width generally causes decrease in modulation bandwidth. Moreover, the increase in the current confinement width leads to multi-mode, which is unsuitable for a communication where a single-mode fiber is used. Also, in a case of an edge emitting type laser, the increase in the active layer stripe width causes multi-mode, which is of a problem.

In order to solve the above-mentioned problems, a technique that uses a tunnel junction to invert carriers (electrons-holes) is proposed. More specifically, most of p-type semiconductor with high resistance is replaced by n-type semiconductor due to the carrier inversion, and thereby the resistance is reduced. Such a structure is often employed in the vertical cavity surface emitting laser in the 1.55 micrometer band. However, electric properties of the conventional tunnel junction were not sufficient. That is to say, voltage drop, namely the resistance is high in the conventional tunnel junction, which cancels the effect of the replacement by the n-type semiconductor. Thus, the sufficient lowering of the resistance can not be achieved as a whole. Moreover, in the tunnel junction, carrier tunneling probability becomes lower as the band gap becomes larger. Therefore, the resistance of the tunnel junction section becomes higher as the wavelength of the laser becomes shorter. For this reason, the tunnel junction is scarcely employed in the vertical cavity surface emitting laser in the 1.3 micrometer band, for example.

The followings are publicly known as documents in which a tunnel junction having a hetero-junction interface is described. According to the technique described in Japanese Laid-Open Patent Application JP-P2002-134835A, compound semiconductor whose composition is different between the p-side and the n-side of the junction is used. More specifically, an energy level at the conduction band edge of the n-side semiconductor is lower than an energy level at the conduction band edge of the p-side semiconductor, and an energy level at the valence band edge of the n-side semiconductor is lower than an energy level at the valence band edge of the p-side semiconductor. In other words, a so-called Type-II hetero-junction is used. Also, according to the technique described in Japanese Laid-Open Patent Application JP-P2004-336039A, an InGaP layer is inserted on the n-side of the junction, and concentration of Si as the n-type dopant is increased as compared with a GaAs layer.

In National Publication of the Translated Version of PCT Application JP-P2003-518326, a type-II interband hetero structure diode is described. The diode includes a hetero structure consisting of a first layer of InAs and a second layer of GaSb or InGaSb. The first layer and the second layer are separated by an interface layer made of aluminum antimonide. The interface layer is sufficiently thin and a bias tunneling phenomenon occurs through the interface layer.

DISCLOSURE OF INVENTION

An object of the present invention is to provide a technique that can further reduce a resistance of a tunnel junction light emitting device having a tunnel junction.

In a first aspect of the present invention, a tunnel junction light emitting device is provided with an active layer and an electron tunneling region for supplying the active layer with carriers. The electron tunneling region has a tunnel junction, and the tunnel junction is constituted by two or more kinds of p-type semiconductor layers and one or more kinds of n-type semiconductor layers. More specifically, the electron tunneling region is provided with at least a first p-type semiconductor layer, a second p-type semiconductor layer and an n-type semiconductor layer. The second p-type semiconductor layer is sandwiched between the first p-type semiconductor layer and the n-type semiconductor layer. The first p-type semiconductor layer, the second p-type semiconductor layer and the n-type semiconductor layer form a tunnel junction to which a reverse bias is applied. By applying the reverse bias, electrons tunnel from the first p-type semiconductor layer side to the n-type semiconductor layer side, namely a current flows. The first p-type semiconductor layer serves as a source of the electron tunneling. Also, it is preferable that a thickness of the second p-type semiconductor layer is less than 5 nm.

According to the present invention, an energy level at a valence band edge of the second p-type semiconductor layer is equal to or lower than an energy level at a valence band edge of the first p-type semiconductor layer. It is preferable that an energy level at a conduction band edge of the second p-type semiconductor layer is lower than an energy level at a conduction band edge of the first p-type semiconductor layer. It is also preferable that doping concentration in the second p-type semiconductor layer is higher than doping concentration in the first p-type semiconductor layer. Consequently, barrier through which electrons are to tunnel is reduced and thus the tunneling probability is increased. As a result, a large current flows with a low voltage. In other words, the resistance is reduced. It should be noted that the high or low of the energy level is based on a comparison result of the energy levels when considering a band lineup under a condition that the respective semiconductor layers constituting the above-mentioned electron tunneling region are not doped.

In a second aspect of the present invention, a tunnel junction light emitting device is provided with an active layer and an electron tunneling region for supplying the active layer with carriers. The electron tunneling region is provided with at least a first p-type semiconductor layer, a second p-type semiconductor layer and an n-type semiconductor layer. The second p-type semiconductor layer is sandwiched between the first p-type semiconductor layer and the n-type semiconductor layer. The first p-type semiconductor layer, the second p-type semiconductor layer and the n-type semiconductor layer form a tunnel junction to which a reverse bias is applied. By applying the reverse bias, electrons tunnel from the first p-type semiconductor layer side to the n-type semiconductor layer side, namely a current flows. The first p-type semiconductor layer and the second p-type semiconductor layer form a Type-II hetero-interface.

In the above tunnel junction light emitting device, it is preferable that an energy level at a conduction band edge of the first p-type semiconductor layer is higher than an energy level at a conduction band edge of the n-type semiconductor layer. It is also preferable that an energy level at a valence band edge of the first p-type semiconductor layer is higher than an energy level at a valence band edge of the n-type semiconductor layer.

In a third aspect of the present invention, a tunnel junction light emitting device is provided with an active layer and an electron tunneling region for supplying the active layer with carriers. The electron tunneling region is provided with at least a first p-type semiconductor layer, a second p-type semiconductor layer and an n-type semiconductor layer. The second p-type semiconductor layer is sandwiched between the first p-type semiconductor layer and the n-type semiconductor layer. The first p-type semiconductor layer, the second p-type semiconductor layer and the n-type semiconductor layer form a tunnel junction to which a reverse bias is applied. By applying the reverse bias, electrons tunnel from the first p-type semiconductor layer side to the n-type semiconductor layer sides namely a current flows. A thickness of the second p-type semiconductor layer is less than 5 nm.

In a fourth aspect of the present invention, a tunnel junction light emitting device is provided with an active layer and an electron tunneling region for supplying the active layer with carriers. The electron tunneling region is provided with a tunnel junction that includes a p-type semiconductor layer and an n-type semiconductor layer, and a reverse bias is applied to the tunnel junction. At least a part of the p-type semiconductor layer is made of compound semiconductor including at least one of Sb and P. Concentration of the element increases from the p-n interface towards the p-type layer direction.

In a fifth aspect of the present invention, a tunnel junction light emitting device is provided with an active layer and an electron tunneling region for supplying the active layer with carriers. The electron tunneling region is provided with a tunnel junction that includes a p-type semiconductor layer and an n-type semiconductor layer, and a reverse bias is applied to the tunnel junction. At least a part of the p-type semiconductor layer is made of compound semiconductor including at least one of In and N.

It is preferable that the present invention is applied to a vertical cavity surface emitting laser.

According to the tunnel junction light emitting device of the present invention, the resistance is further reduced as compared with the conventional technique.

BEST MODE FOR CARRYING OUT THE INVENTION

A tunnel junction light emitting device according to embodiments of the present invention will be described below in detail with reference to the attached drawings.

First Embodiment

Figure 1A:
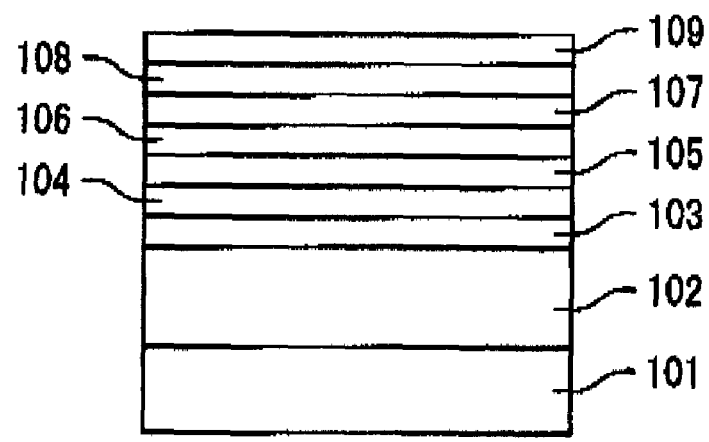
FIG. 1A is a cross-sectional view showing a manufacturing process of a tunnel junction light emitting device according to a first embodiment of the present invention.
Figure 1B:
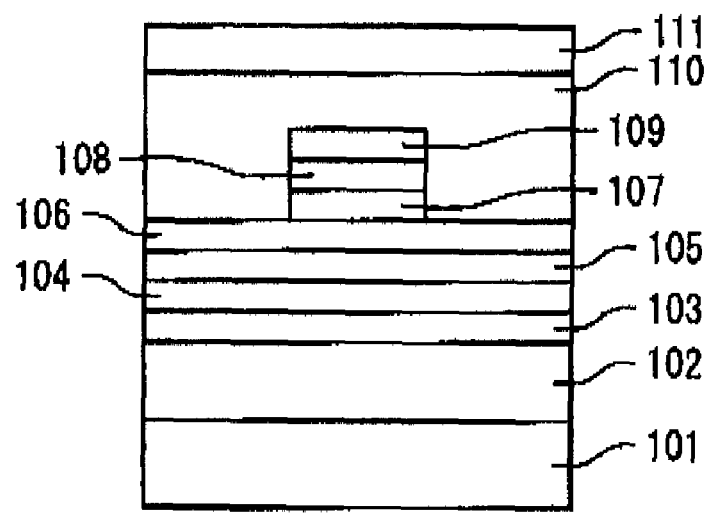
FIG. 1B is a cross-sectional view showing a manufacturing process of the tunnel junction light emitting device according to the first embodiment of the present invention.
Figure 1C:
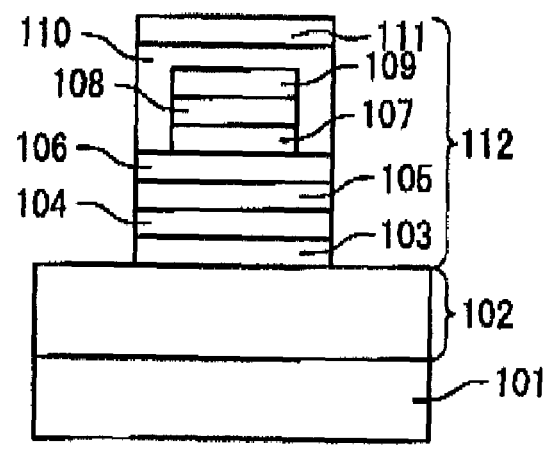
FIG. 1C is a cross-sectional view showing a manufacturing process of the tunnel junction light emitting device according to the first embodiment of the present invention.
Figure 1D:
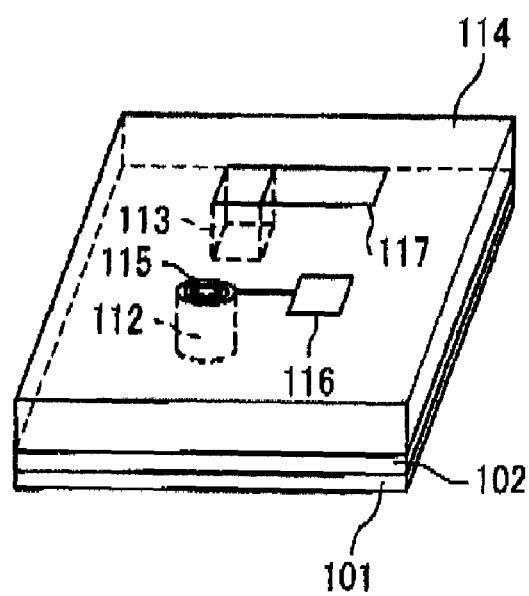
FIG. 1D is a perspective view showing a structure of the tunnel junction light emitting device according to the first embodiment of the present invention.

FIGS. 1A to 1C are cross-sectional views showing a manufacturing process of a tunnel junction light emitting device according to the first embodiment. FIG. 1D is a perspective view showing a structure of the tunnel junction light emitting device according to the first embodiment. In the first embodiment, a vertical cavity surface emitting laser whose oscillation wavelength is 1.3 micrometer that is formed on a substrate 101 made of GaAs is explained as an example.

As shown in FIG. 1A, a first DBR layer 102 is first formed on the substrate 101 made of n-type GaAs. The first DBR layer 102 consists of a plurality of DBRs, where each DBR (n-type semiconductor mirror layer) as a basic unit is constituted by a pair of an n-type GaAs layer and an n-type $Al_{0.9}Ga_{0.1}As$ layer. A clad layer 103 made of n-type $Al_{0.3}Ga_{0.7}As$, an active layer 104 including non-doped GaInAs quantum well and a GaAs barrier layer, and a clad layer 105 made of p-type $Al_{0.3}Ga_{0.7}As$ are formed in this order on the first DBR layer 102. Moreover, a p-GaAs layer 106, a $p^+$-$In_{0.1}Ga_{0.9}As$ layer 107, a $p^+$-$Ga_{0.9}In_{0.1}N_{0.02}As_{0.098}$ layer 108, and an $n^+$-$Ga_{0.9}In_{0.1}N_{0.02}As_{0.098}$ layer 109 are formed in this order on the clad layer 105 (first process).

Those layers can be formed, for example, by using a metal organic chemical vapor deposition (MOCVD) method. Here, C is used as p-type dopant with respect to the $p^+$-$In_{0.1}Ga_{0.9}As$ layer 107 and the $p^+$-$Ga_{0.9}In_{0.1}N_{0.02}As_{0.098}$ layer 108. On the other hand, Se is used as n-type dopant with respect to the $n^+$-$Ga_{0.9}In_{0.1}N_{0.02}As_{0.098}$ layer 109. The p-type doping concentration is $8 \times 10^{19}$ cm$^{-3}$, and the n-type doping concentration is $5 \times 10^{19}$ cm$^{-3}$. A film thickness of the $p^+$-$In_{0.1}Ga_{0.9}As$ layer 107 is 5 nm, a film thickness of the $p^+$-$Ga_{0.9}In_{0.01}N_{0.002}As_{0.098}$ layer 108 is 1.8 nm, and a film thickness of the $n^+$-$Ga_{0.9}In_{0.1}N_{0.02}As_{0.098}$ layer 109 is 10 nm.

Next, a circular resist pattern of about 6 micrometers in diameter is formed by the use of a photolithography technique. By an etching using the resist pattern as a mask, the $p^+$-$In_{0.1}Ga_{0.9}As$ layer 107, the $p^+$-$Ga_{0.9}In_{0.1}N_{0.02}As_{0.098}$ layer 108 and the $n^+$-$Ga_{0.9}In_{0.01}N_{0.02}As_{0.098}$ g layer 109 are removed. After that, the resist pattern is removed (second process). Consequently, as shown in FIG. 1B, the $p^+$-InGaAs layer 107, the $p^+$-GaInNAs layer 108 and the $n^+$-GaInNAs layer 109 which are processed to have cylindrical configurations are obtained. In the present embodiment, these cylindrically-shaped $p^+$-InGaAs layer 107, $p^+$-GaInNAs layer 108 and $n^+$-GaInNAs layer 109 serve as an "electron tunneling section (electron tunneling region)" for supplying the above-mentioned active layer 104 with carriers.

Next, an n-GaAs layer 110 and a second DBR layer 111 are formed in this order by the use of the MOCVD method. The second DBR layer 111 consists of a plurality of DBRs, where each DBR (n-type semiconductor mirror layer) as a basic unit is constituted by a pair of an n-type GaAs layer and an n-type $Al_{0.9}Ga_{0.1}As$ layer (third process). Consequently, as shown in FIG. 1B, the above-mentioned electron tunneling section becomes covered by the n-GaAs layer 110. Also, in each DBR layer, a film thickness of each of the GaAs layer, which is a high refractive index layer, and the $Al_{0.9}Ga_{0.1}As$ layer, which is a low refractive index layer, is designed such that an optical path length in each medium becomes approximately one-fourth of the oscillation wavelength.

Next, a dielectric film is deposited on the second DBR layer 111. Then, a resist pattern of about 20 micrometers in diameter is formed on the dielectric film by the use of the photolithography technique. The resist pattern has a circular (disk) shape whose central axis is aligned with that of the electron tunneling section of 6 micrometers in diameter that is formed in the second process. Next, the dielectric is etched by a dry etching using the resist pattern as a mask. After that, the resist pattern is removed and a circular dielectric pattern is generated. Subsequently, by a dry etching using the dielectric pattern as a mask, an etching process is carried out until a surface of the first DBR layer 102 is exposed (fourth process). After that, the above-mentioned dielectric pattern is removed. Consequently, as shown in FIG. 1C, a columnar structure 112 of about 20 micrometers in diameter is formed.

Next, as shown in FIG. 1D, an electrode 113 is formed on the first DBR layer 102 that is exposed by the foregoing mesa-etching. More specifically, resist is first applied to the entire region. Then, the lithography technique is used to form a resist pattern in which only a portion where the electrode is formed is removed. Subsequently, a Ti/Pt/Au film is deposited. After that, a liftoff is carried out by removing the resist pattern. As a result, the electrode 113 is formed on a part of the first DBR layer 102 (the columnar structure 112) (fifth process).

Next, as shown in FIG. 1D, polyimide resin is applied and a polyimide layer 114 is formed. Subsequently, the lithography technique is used to remove the polyimide on the electrode 113 formed in the foregoing fifth process (sixth process).

Next, an electrode 115 connected to the second DBR layer 111 is formed. As in the formation of the above-described electrode 113, resist is first applied to the entire region and then a resist pattern is formed by the lithography technique. Subsequently, a Ti/Pt/Au film is deposited. After that, a liftoff is carried out by removing the resist pattern. As a result, as shown in FIG. 1D, the electrode 115 and a pad electrode 116 connected to the electrode are formed. Also, a pad electrode 117 connected to the electrode 113 is simultaneously formed on the polyimide layer 114 (seventh process).

It should be noted that described in the above example is the case where one vertical cavity surface emitting laser is formed. However, a plurality of vertical cavity surface emitting lasers may be formed on the substrate 101 made of GaAs. In this case, the plurality of vertical cavity surface emitting lasers formed on the substrate 101 are carved out one by one or in a desired array shape (for example, 1×10, 100×100 or the like) and used.

By the above-described manufacturing process, the vertical cavity surface emitting laser according to the first embodiment is obtained. According to the present embodiment, the $p^+$-$In_{0.1}Ga_{0.9}As$ layer 107, the $p^+$-$Ga_{0.9}In_{0.1}N_{0.02}As_{0.098}$ layer 108 and the $n^+$-$Ga_{0.9}In_{0.1}N_{0.02}As_{0.098}$ layer 109 form a tunnel junction and constitute a section (the electron tunneling region) through which electrons tunnel. The p-type layer 107 and the n-type layer 109 are made of the same compound semiconductor, while the p-type layers 107 and 108 are made of different compound semiconductors. An energy level at the conduction band edge of the $Ga_{0.9}In_{0.1}N_{0.02}As_{0.098}f$ (the p-type layer 108) is lower than that of the $In_{0.1}Ga_{0.9}As$ (the p-type layer 107). Also, an energy level at the valence band edge of the $Ga_{0.9}In_{0.1}N_{0.02}As_{0.098}$ (the p-type layer 108) is approximately equal to that of the $In_{0.1}Ga_{0.9}As$ (the p-type layer 107). It should be noted that the high or low of the energy level is based on a comparison result of the energy levels when considering a band lineup under a condition that the respective semiconductor layers constituting the electron tunneling region are not doped.

Figure 1E:
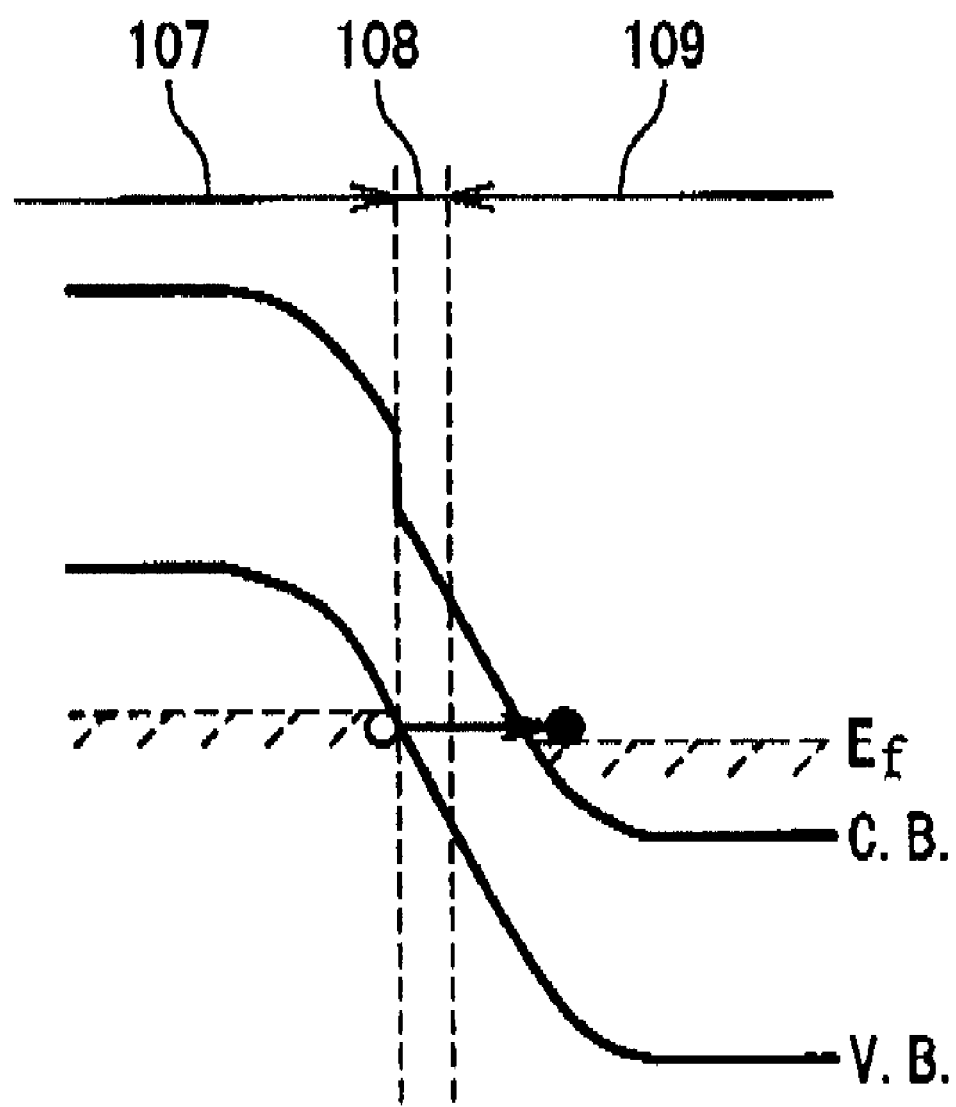
FIG. 1E is an energy band diagram of an electron tunneling region according to the first embodiment of the present invention.

Thus, the energy band of the electron tunneling region according to the present embodiment is as shown in FIG. 1E. Here, voltages are applied such that the electrode 115 is positive while the electrode 113 is negative. That is to say, a reverse bias is applied to the tunnel junction. As a result, electrons tunnel from the side of the $p^+$-InGaAs layer 107 to the side of the $n^+$-GaInNAs layer 109, and thus holes are supplied to the side of the active layer 104. A thickness of the $p^+$-GaInNAs layer 108 sandwiched between the p-type layer 107 and the n-type layer 109 is designed to be substantially between the p-n junction interface and a position at which a quasi-Fermi level (Ef) and the valence band (V.B.) edge intersect with each other. Consequently, electrons tunnel through only the $p^+$-GaInNAs layer 108 and the $n^+$-GaInNAs layer 109 where the energy level at the conduction band (C.B.) edge is low. As a result, according to the present embodiment, the tunneling probability is increased as compared with the conventional structure. In other words, a large current flows with a low voltage in the tunnel junction light emitting device according to the present embodiment. This means that the resistance is reduced.

It should be noted that the $p^+$-$In_{0.1}Ga_{0.9}As$ layer 107, the $p^+$-$Ga_{0.9}In_{0.1}N_{0.02}As_{0.098}$ layer 108 and the $n^+$-$Ga_{0.9}In_{0.1}N_{0.02}As_{0.098}$ layer 109, which are associated with the electron tunneling section, are formed in the above-described second process to have the cylindrical configuration of about 6 micrometers in diameter. The tunneling probability in the other section is extremely low. As a result, a structure that the tunnel current flows through only the cylindrical section is attained. Furthermore, since the refractive indices of those layers are higher than the refractive index of the GaAs layer, the cylindrical section has an optical waveguide effect. Also, the doping concentration in the electron tunneling section is set high in order to improve the tunneling probability. Thus, an optical-absorption coefficient in the electron tunneling section is higher than that of another layer. Therefore, the electron tunneling section is arranged at a node of standing wave that is generated when the vertical cavity surface emitting laser oscillates. Such the arrangement of the electron tunneling section as described above enables it to suppress absorption of light.

Second Embodiment

Figure 2A:
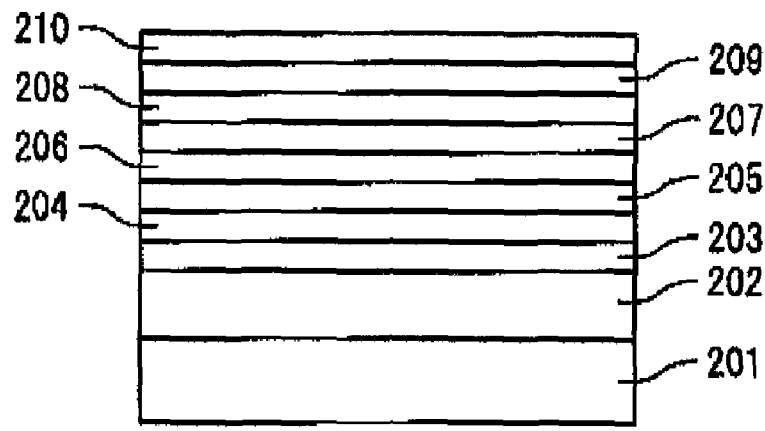
FIG. 2A is a cross-sectional view showing a manufacturing process of a tunnel junction light emitting device according to a second embodiment of the present invention.
Figure 2B:
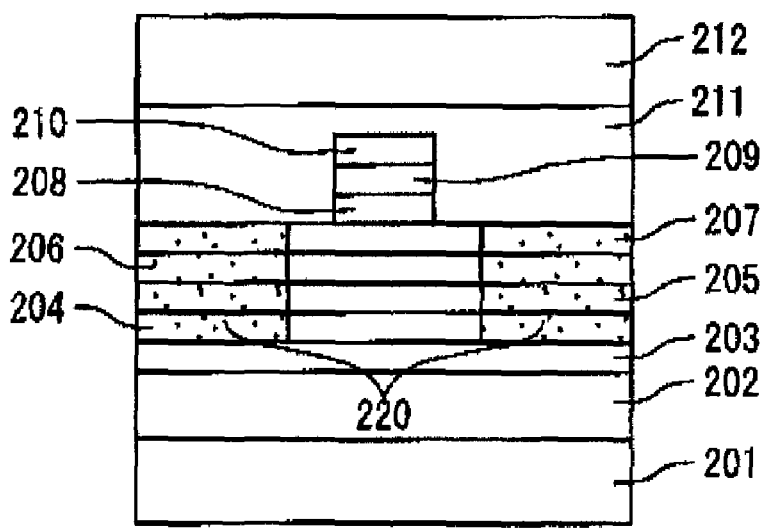
FIG. 2B is a cross-sectional view showing a manufacturing process of the tunnel junction light emitting device according to the second embodiment of the present invention.
Figure 2C:
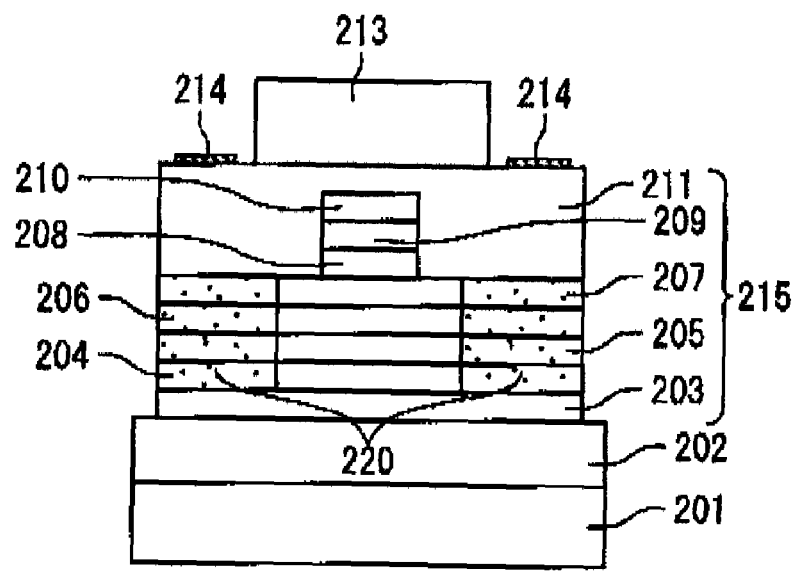
FIG. 2C is a cross-sectional view showing a manufacturing process of the tunnel junction light emitting device according to the second embodiment of the present invention.
Figure 2D:
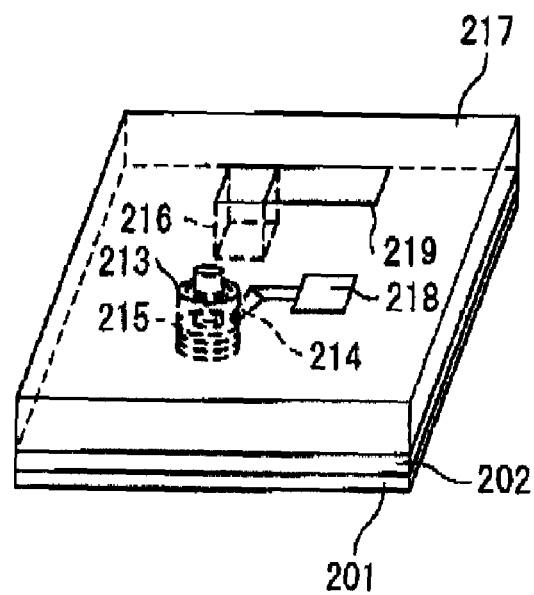
FIG. 2D is a perspective view showing a structure of the tunnel junction light emitting device according to the second embodiment of the present invention.

FIGS. 2A to 2C are the cross-sectional views showing a manufacturing process of a tunnel junction light emitting device according to the second embodiment. FIG. 2D is a perspective view showing a structure of the tunnel junction light emitting device according to the second embodiment. In the second embodiment, a vertical cavity surface emitting laser whose oscillation wavelength is 1.15 micrometer that is formed on a substrate 201 made of GaAs is explained as an example.

As shown in FIG. 2A, a first DBR layer 202 is first formed on the substrate 201 made of n-type GaAs. The first DBR layer 202 consists of a plurality of DBRs, where each DBR (n-type semiconductor mirror layer) as a basic unit is constituted by a pair of an n-type GaAs layer and an n-type $Al_{0.9}Ga_{0.1}As$ layer. An oxide layer formation layer 203 made of n-type $Al_xGa_{1-x}As$ (0.9<x<1), a clad layer 204 made of n-type $Al_{0.3}Ga_{0.7}As$, an active layer 205 including non-doped $In_{0.35}Ga_{0.65}As$ quantum well and a GaAs barrier layer, and a clad layer 206 made of p-type $Al_{0.3}Ga_{0.7}As$ are formed in this order on the first DBR layer 202. A p-GaAs layer 207, a $p^+$-$GaAs_{0.9}Sb_{0.1}$ layer 208, a $p^+$-$GaAs_{0.98}N_{0.02}$ layer 209, and an $n^+$-$Ga_{0.93}In_{0.07}N_{0.91}As_{0.99}$ layer 210 are formed in this order on the clad layer 206 (first process).

Those layers can be formed, for example, by using a metal organic chemical vapor deposition method. Here, C is used as p-type dopant with respect to the $p^+$-$GaAs_{0.9}Sb_{0.1}$ layer 208 and the $p^+$-$GaAs_{0.98}N_{0.02}$ layer 209. On the other hand, Se is used as n-type dopant with respect to the $n^+$-$Ga_{0.93}In_{0.07}N_{0.01}As_{0.99}$ layer 210. Also, the p-type doping concentration with respect to the $p^+$-$GaAs_{0.9}Sb_{0.1}$ layer 208 and the $p^+$-$GaAs_{0.98}N_{0.02}$ layer 209 are $1\times10^{20}$ cm$^{-3}$. The n-type doping concentration with respect to the $n^+$-$Ga_{0.39}In_{0.07}N_{0.01}As_{0.99}$ layer 210 is $5\times10^{19}$ cm$^{-3}$. A film thickness of the $p^+$-$GaAs_{0.9}Sb_{0.1}$ layer 208 is 5 nm, a film thickness of the $p^+$-$GaAs_{0.98}N_{0.02}$ layer 209 is 1.3 nm, and a film thickness of the $n^+$-$Ga_{0.93}In_{0.07}N_{0.01}As_{0.99}$ layer 210 is 10 nm.

Next, by the photolithography technique, a circular resist pattern of about 8 micrometers in diameter is formed on the $n^+$-$Ga_{0.93}In_{0.07}N_{0.01}As_{0.99}$ layer 210. After that, a Ti ion injection process is performed and an ion-implanted region 220 is formed as shown in FIG. 2B (second process). As a result, resistance of the portion (ion-implanted region 220) other than the resist pattern is increased.

Next, the foregoing resist pattern is removed and then another circular resist pattern of 4 micrometers in diameter is formed on the $n^+$-$Ga_{0.93}In_{0.07}N_{0.01}As_{0.99}$ layer 210. This resist pattern is formed such that its central axis is aligned with that of the resist pattern used in the second process.

Subsequently, by an etching using the new resist pattern as a mask, the p+-GaAs$_{0.9}$Sb$_{0.1}$ layer 208, the p+-GaAs$_{0.98}$N$_{0.02}$ layer 209 and the n+-Ga$_{0.93}$In$_{0.07}$N$_{0.01}$As$_{0.99}$ layer 210 are removed (third process) Consequently, as shown in FIG. 2B, the p+-GaAsSb layer 208, the p+-GaAsN layer 209 and the n+-GaInNAs layer 210 are processed to have cylindrical configurations. In the present embodiment, the cylindrically-shaped section serves as an "electron tunneling section (electron tunneling region)" for supplying the above-mentioned active layer 205 with carriers. After the etching process, the resist pattern is removed.

Next, an n-GaAs layer 211 and a second DBR layer 212 are formed in this order by the use of the MOCVD method. The second DBR layer 212 consists of a plurality of DBRs, where each DBR (non-doped semiconductor mirror layer) as a basic unit is constituted by a pair of a non-doped GaAs layer and a Al$_{0.9}$Ga$_{0.1}$As layer (fourth process). Consequently, as shown in FIG. 2B, the above-mentioned electron tunneling section becomes covered by the n-GaAs layer 211. It should be noted that in each DBR constituting the second DBR layer 212, a film thickness of each of the GaAs layer, which is a high refractive index layer, and the Al$_{0.9}$Ga$_{0.1}$As layer, which is a low refractive index layer, is designed such that an optical path length in each medium becomes approximately one-fourth of the oscillation wavelength.

Next, a circular dielectric pattern of 10 micrometers in diameter, whose central axis is aligned with that of the circular electron tunneling section formed in the third process, is formed. Subsequently, the second DBR layer 212 is removed by a dry etching using the circular dielectric pattern as a mask. As a result, as shown in FIG. 2C, a columnar structure 213 of about 10 micrometers in diameter is formed (fifth process). The dry etching is carried out until a surface of the n-GaAs layer 211 is exposed. Next, an electrode 214 having a ring shape and made of AuGeNi is formed on the n-GaAs layer 211 that is exposed around the columnar structure 213 (sixth process).

Next, a circular dielectric pattern of 30 micrometers in diameter, whose central axis is aligned with that of the columnar structure 213 formed in the fifth process, is formed. Subsequently, a dry etching using the dielectric pattern as a mask is carried out. As a result, as shown in FIG. 2C, a columnar structure 215 of about 30 micrometers in diameter that reaches the first DBR layer 202 is formed (seventh process). Due to the process, a side surface of the oxide layer formation layer 203 is exposed. After that, the dielectric pattern is removed.

Next, a heat treatment is performed in water vapor atmosphere at a temperature of about 400 degrees centigrade for about 10 minutes (eighth process). As a result, only the oxide layer formation layer 203 is selectively and annularly oxidized. The oxidation condition is controlled such that a non-oxidized region of about 5 micrometers in diameter remains at the center of the oxide layer formation layer 203. Note that the reason why the oxide layer formation layer 203 is made of the n-type Al$_x$Ga$_{1-x}$As (0.9<x<1) is as follows. That is, the oxidation scarcely occurs if the x is 0.9 or less. Also, the reason is that the rate of oxidation in the oxide layer formation layer 203 needs to be higher than that in the DBR.

Next, as shown in FIG. 2D, an electrode 216 is formed on the first DBR layer 202 that is exposed in the seventh process. More specifically, resist is first applied to the entire region. Then, the lithography technique is used to form a resist pattern in which only a portion where the electrode is formed is removed. Subsequently, a Ti/Pt/Au film is deposited. After that, a liftoff is carried out by removing the resist pattern. As a result, the electrode 216 is formed on a part of the first DBR layer 202 (eighth process).

Next, as shown in FIG. 2D, polyimide resin is applied and a polyimide layer 217 is formed. Subsequently, the lithography technique is used to remove the columnar structure 215 formed in the foregoing seventh process and the polyimide on the electrode 216 formed in the foregoing eighth process (ninth process). Next, pad electrodes 218 and 219 are formed on the polyimide layer 217. The pad electrodes 218 and 219 are respectively connected to the ring-shaped electrode 214 formed in the foregoing sixth process and the electrode 216 formed in the foregoing eighth process (tenth process).

It should be noted that described in the above example is the case where one vertical cavity surface emitting laser is formed. However, a plurality of vertical cavity surface emitting lasers may be formed on the substrate 201. In this case, the plurality of vertical cavity surface emitting lasers formed on the substrate 201 are carved out one by one or in a desired array shape (for example, 1×10, 100×100 or the like) and used.

By the above-described manufacturing process, the vertical cavity surface emitting laser according to the second embodiment is obtained. According to the present embodiment, the p+-GaAs$_{0.9}$Sb$_{0.1}$ layer 208, the p+-GaAs$_{0.98}$N$_{0.02}$ layer 209 and the n+-Ga$_{0.93}$In$_{0.07}$As$_{0.98}$ layer 210 form a tunnel junction and constitute a section (the electron tunneling region) through which electrons tunnel. An energy level at the conduction band edge of the p+-GaAsSb layer 208 is higher than that of the p+-GaAsN layer 209 and that of the n+-GaInNAs layer 210. Also, an energy level at the valence band edge of the p+-GaAsSb layer 208 is higher than that of the p+-GaAsN layer 209 and that of the n+-GaInNAs layer 210. That is to say, according to the present embodiment, a so-called Type-II hetero-interface is formed.

Figure 2E:
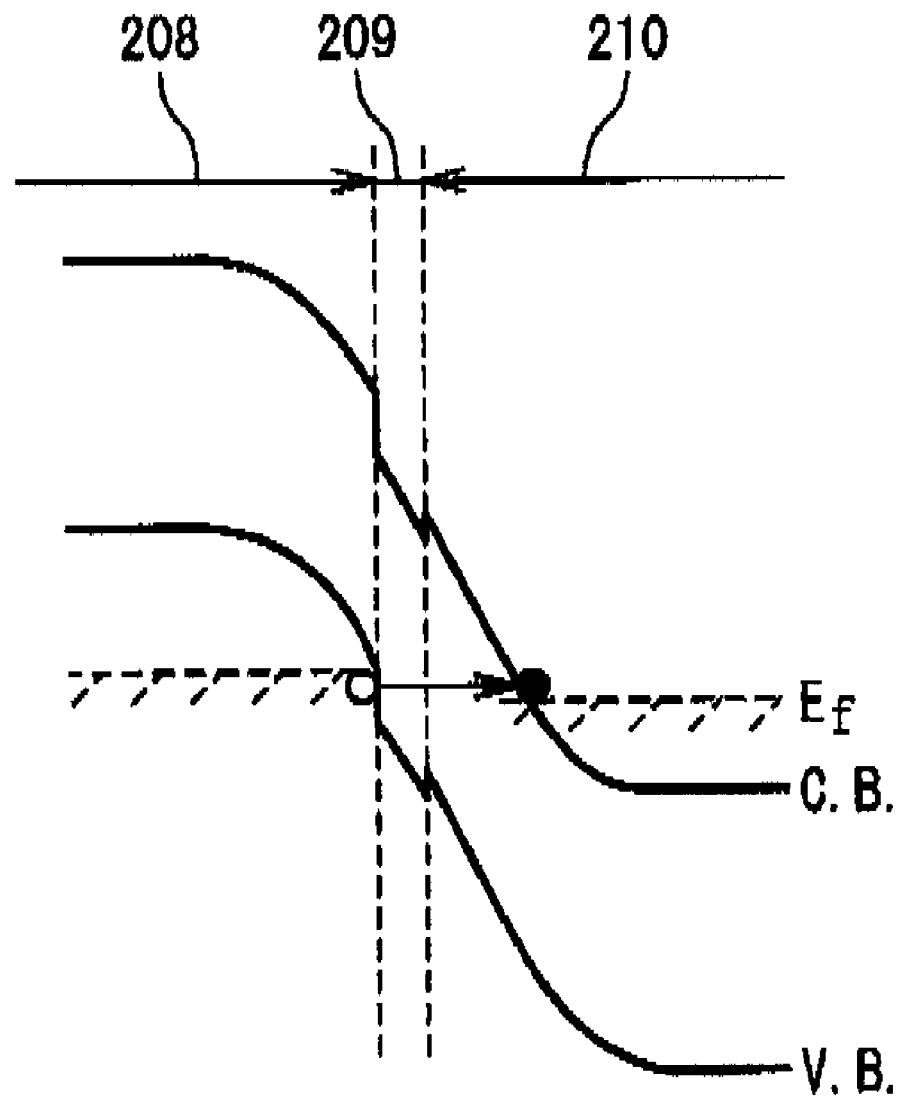
FIG. 2E is an energy band diagram of an electron tunneling region according to the second embodiment of the present invention.

The energy band of the electron tunneling region according to the present embodiment is as shown in FIG. 2E. Here, a reverse bias is applied to the tunnel junction. A thickness of the p+-GaAsN layer 209 sandwiched between the p-type layer 208 and the n-type layer 210 is designed to be between the p-n junction interface and a position at which the quasi-Fermi level (Ef) and the valence band (V.B.) intersect with each other. Consequently, electrons tunnel through only the p+-GaAs$_{0.98}$N$_{0.02}$ layer 209 and the n+-Ga$_{0.93}$In$_{0.07}$N$_{0.01}$As$_{0.99}$% layer 210 where the energy level at the conduction band (C.B.) edge is low. As a result, according to the present embodiment, the tunneling probability is increased as compared with the conventional structure. In other words, a large current flows with a low voltage in the tunnel junction light emitting device according to the present embodiment. This means that the resistance is reduced.

According to the electron tunneling section of the vertical cavity surface emitting laser in the present embodiment, a hetero-interface is formed in the p-type semiconductor. Moreover, the p-n interface is also a hetero-interface. There is a tendency that diffusion of the dopant is suppressed at the hetero-interface. Therefore, according to the structure of the present embodiment, the dopant diffusion between the p-n junction is small even if a heat treatment is performed in a crystal growth process, a device fabricating process or the like after the electron tunneling section is formed. Thus, stability of characteristics is improved.

It should be noted that the ion-implanted region 220 and the oxide layer formation layer 203 are often used for the current confinement. However, according to the vertical cavity surface emitting laser of the present embodiment as in the vertical cavity surface emitting laser of the first embodiment, the current confinement is achieved by the cylindrically-shaped electron tunneling section that is embedded. The ion-implanted region 220 and the oxide layer formation layer 203 do not serve the function of the current confinement. The ion-implanted region 220 plays a role of reducing electric capacitance around the electron tunneling section in the columnar structure 215. Consequently, an upper limit of modulation band that is determined by the device resistance and capacitance becomes higher, which enables the ultrafast modulation. Also, the oxide layer formation layer 203 is used for controlling optical confinement in a transverse direction. It is possible to make an adjustment of the optical confinement by controlling the opening diameter of the non-oxidized region in the oxide layer formation layer 203.

Third Embodiment

Figure 3A:
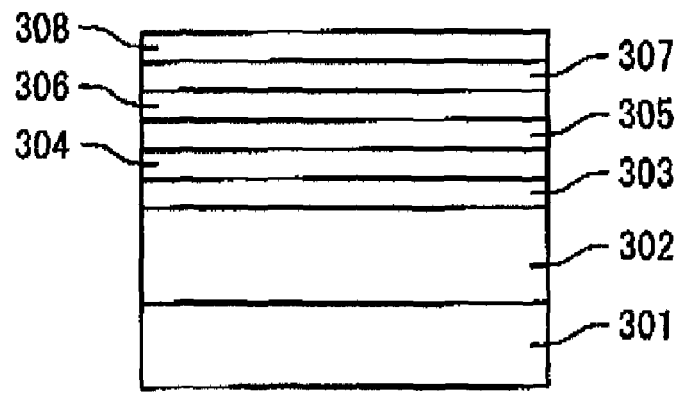
FIG. 3A is a cross-sectional view showing a manufacturing process of a tunnel junction light emitting device according to a third embodiment of the present invention.
Figure 3B:
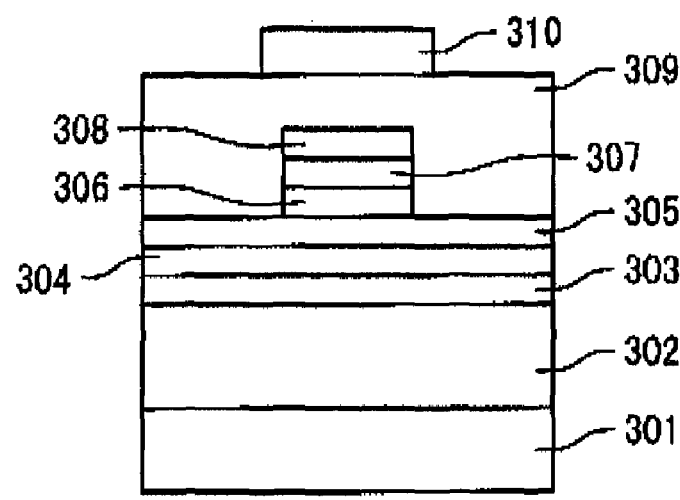
FIG. 3B is a cross-sectional view showing a manufacturing process of the tunnel junction light emitting device according to the third embodiment of the present invention.
Figure 3C:
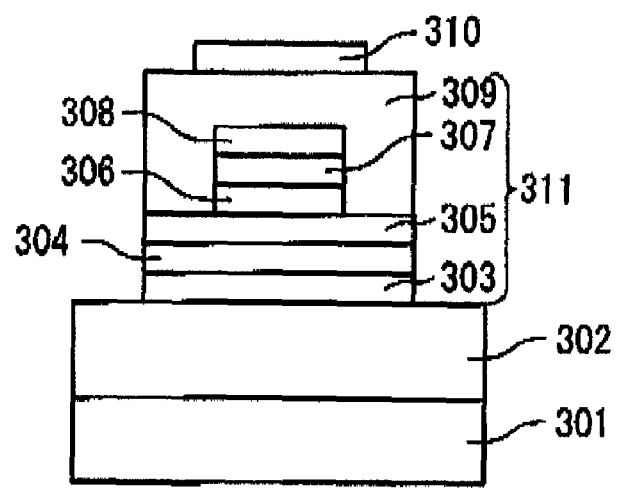
FIG. 3C is a cross-sectional view showing a manufacturing process of the tunnel junction light emitting device according to the third embodiment of the present invention.
Figure 3D:
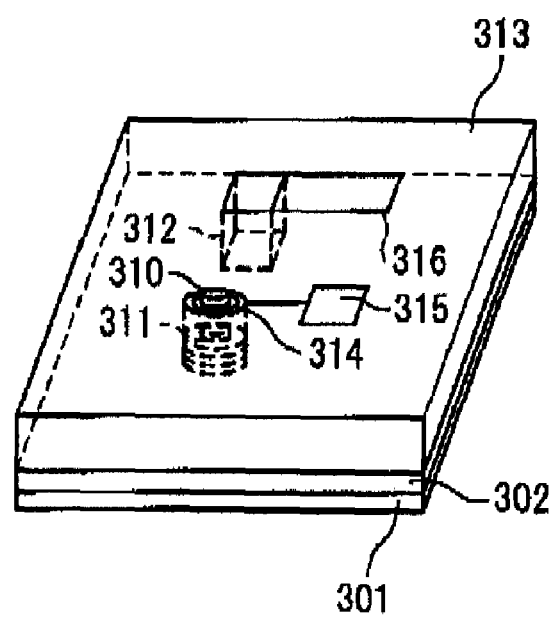
FIG. 3D is a perspective view showing a structure of the tunnel junction light emitting device according to the third embodiment of the present invention.

FIGS. 3A to 3C are cross-sectional views showing a manufacturing process of a tunnel junction light emitting device according to the third embodiment. FIG. 3D is a perspective view showing a structure of the tunnel junction light emitting device according to the third embodiment. In the third embodiment, a vertical cavity surface emitting laser whose oscillation wavelength is 1.3 micrometer that is formed on a substrate 301 made of InP is explained as an example.

First, as shown in FIG. 3A, a first DBR layer 302 is formed on the substrate 301 made of n-type InP. The first DBR layer 302 consists of a plurality of DBRs, where each DBR (n-type semiconductor mirror layer) as a basic unit is constituted by a pair of an n-type InP layer and an n-type AlGaInAs layer that is lattice-matched to InP. A clad layer 303 made of n-type InP, an active layer 304 including non-doped $Al_{0.15}Ga_{0.15}In_{0.7}As$ quantum well and an $Al_{0.34}Ga_{0.22}In_{0.44}As$ barrier layer, and a clad layer 305 made of p-type InP are formed in this order on the first DBR layer 302. Moreover, a $p^+$-$Al_{0.27}Ga_{0.20}In_{0.53}As$ layer 306, a $p^+$-$In_{0.3}Ga_{0.7}As$ layer 307, and an $n^+$-$In_{0.76}Ga_{0.24}As_{0.51}P_{0.49}$ layer 308 are formed in this order on the clad layer 305 (first process).

Those layers can be formed, for example, by using a metal organic chemical vapor deposition (MOCVD) method. Here, C is used as p-type dopant with respect to the $p^+$-$Al_{0.27}Ga_{0.20}In_{0.53}As$ layer 306 and the $p^+$-$In_{0.3}Ga_{0.7}As$ layer 307. On the other hand, Si is used as n-type dopant with respect to the $n^+$-$In_{0.76}Ga_{0.24}As_{0.51}P_{0.49}$ layer 308. The p-type doping concentration for the $p^+$-$Al_{0.27}Ga_{0.20}In_{0.53}As$ layer 306 is $7 \times 10^{19}$ cm$^{-3}$. The p-type doping concentration for the $p^+$-$In_{0.3}Ga_{0.7}As$ layer 307 is $6 \times 10^{19}$ cm$^{-3}$. The n-type doping concentration for the n-type layer 308 is $1.5 \times 10^{19}$ cm$^{-3}$. Also, a film thickness of the $p^+$-$Al_{0.27}Ga_{0.20}In_{0.53}As$ layer 306 is 5 nm, a film thickness of the $p^+$-$In_{0.3}Ga_{0.7}As$ layer 307 is 0.8 nm, and a film thickness of the $n^+$-$In_{0.76}Ga_{0.24}As_{0.51}P$ 0.49 layer 308 is 15 nm.

Next, the photolithography technique is used to form a circular resist pattern of about 6 micrometers in diameter. By an etching using the resist pattern as a mask, the $p^+$-$Al_{0.27}Ga_{0.20}In_{0.53}As$ layer 306, the $p^+$-$In_{0.3}Ga_{0.7}As$ layer 307 and the $n^+$-$In_{0.76}Ga_{0.24}As_{0.51}P_{0.49}$ layer 308 are removed (second process). Consequently, as shown in FIG. 3B, the $p^+$-$Al_{0.27}Ga_{0.20}In_{0.33}As$ layer 306, the $p^+$-$In_{0.3}Ga_{0.7}As$ layer 307 and the $n^+$-$In_{0.76}Ga_{0.24}As_{0.51}P_{0.49}$ layer 308 are processed to have cylindrical configurations. In the present embodiment, the cylindrically-shaped section serves as an "electron tunneling section (electron tunneling region)" for supplying the above-mentioned active layer 304 with carriers. After the etching process, the resist pattern is removed.

Next, an n-type InP layer 309 is formed by the use of the MOCVD method (third process). As a result, the cylindrically-processed $p^+$-$Al_{0.27}Ga_{0.20}In_{0.53}As$ layer 306, $p^+$-$In_{0.3}Ga_{0.7}As$ layer 307 and $n^+$-$In_{0.76}Ga_{0.24}As_{0.51}P_{0.49}$ layer 308 (the electron tunneling section) become covered by the n-type InP layer 309, as shown in FIG. 3B.

Next, $SiO_2$ and amorphous Si (a—Si) are stacked alternately by the use of a sputtering method. Consequently, a second DBR layer 310 in which a plurality of DBRs (dielectric mirror layers) are formed is formed, wherein each DBR as a basic unit is a pair of $SiO_2$ and a—Si. A film thickness of each of the $SiO_2$ layer and the a—Si layer is designed such that an optical path length in each medium becomes approximately one-fourth of the oscillation wavelength. Next, through the lithography and the etching, the second DBR layer 310 is processed to have a circular shape whose central axis is aligned with that of the above-mentioned electron tunneling section. Consequently, as shown in FIG. 3B, the second DBR layer 310 that is processed to have the cylindrical configuration of about 10 micrometers in diameter is formed on the n-type InP layer 309.

Next, the photolithography technique is used to form a resist pattern. The resist pattern has a disk shape whose central axis is aligned with that of the cylindrically-shaped electron tunneling section that is already formed. Subsequently, an etching process is carried out by using the resist pattern as a mask, until a surface of the first DBR layer 302 is exposed (fourth process). After that, the resist pattern is removed. As a result, a columnar structure 311 of about 30 micrometers in diameter is formed, as shown in FIG. 3C.

Next, as shown in FIG. 3D, an electrode 312 is formed on the first DBR layer 302 that is exposed by the foregoing mesa-etching (fifth process). The electrode 312 is formed in the similar way to the first embodiment. Next, as shown in FIG. 3D, polyimide resin is applied and a polyimide layer 313 is formed. The polyimide on the electrode 312 formed in the fifth process is removed by the lithography technique (sixth process).

Next, as shown in FIG. 3D, a ring-shaped electrode 314 and a pad electrode 315 connected to the ring-shaped electrode 314 are formed by a lift-off method. At the same time, a pad electrode 316 connected to the electrode 312 is formed on the polyimide layer 313 (seventh process).

It should be noted that described in the above example is the case where one vertical cavity surface emitting laser is formed. However, a plurality of vertical cavity surface emitting lasers may be formed on the substrate 301. In this case, the plurality of vertical cavity surface emitting lasers formed on the substrate 301 are carved out one by one or in a desired array shape (for example, 1×10, 100×100 or the like) and used.

By the above-described manufacturing process, the vertical cavity surface emitting laser according to the third embodiment is obtained. According to the present embodiment, the $p^+$-$Al_{0.27}Ga_{0.20}In_{0.53}As$ layer 306, the $p^+$-$In_{0.3}Ga_{0.7}As$ layer 307 and the $n^+$-$In_{0.76}Ga_{0.24}As_{0.51}P_{0.49}$ layer 308 form a tunnel junction and constitute a section (the electron tunneling region) through which electrons tunnel. An energy level at the conduction band edge of the p-type layer 307 is lower than that of the p-type layer 306. Also, an energy level at the valence band edge of the p-type layer 307 is lower than that of the p-type layer 306.

Figure 3E:
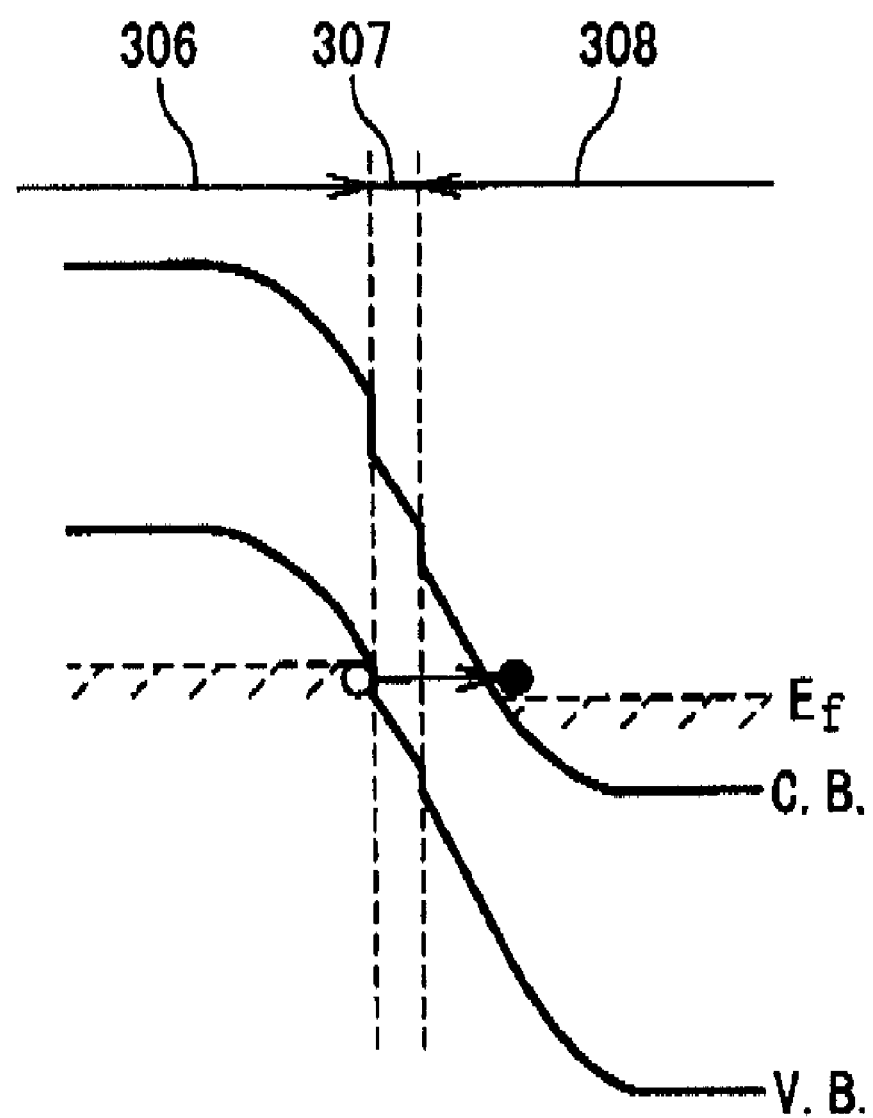
FIG. 3E is an energy band diagram of an electron tunneling region according to the third embodiment of the present invention.

Thus, the energy band of the electron tunneling region according to the present embodiment is as shown in FIG. 3E. Here, voltages are applied such that the pad electrode 315 (ring-shaped electrode 314) is positive while the pad electrode 316 is negative. That is to say, a reverse bias is applied to the tunnel junction. As a result, electrons tunnel from the $p^+$-Al InGaAs layer 306 to the side of the $n^+$-InGaAaP layer 308, and thus holes are supplied to the side of the active layer 304. A thickness of the p$^+$-InGaAs layer 307 sandwiched between the p-type layer 306 and the n-type layer 308 is designed to be between the p-n junction interface and a position at which the quasi-Fermi level (Ef) and the valence band (V.B.) intersect with each other. Consequently, electrons tunnel through only the p$^+$-In$_{0.3}$Ga$_{0.7}$As layer 307 and the n$^+$-In$_{0.76}$Ga$_{0.24}$As$_{0.51}$P$_{0.49}$ layer 308 where the energy level at the conduction band (C.B.) edge is low. As a result, according to the present embodiment, the tunneling probability is increased as compared with the conventional structure. In other words, a large current flows with a low voltage in the tunnel junction light emitting device according to the present embodiment. This means that the resistance is reduced.

It should be noted that, in the vertical cavity surface emitting laser according to the present embodiment as in the vertical cavity surface emitting laser according to the first embodiment, the electron tunneling section is designed to be located at a node of standing wave that is generated at the time of oscillation. As a result, the absorption of light is suppressed.

Moreover, according to the present embodiment, AlGaInAs and InGaAsP that are four element mixed crystal are used for a part of the electron tunneling section. In this case, it is possible by changing composition to change band lineup and lattice constant. It is possible to select the composition with which the band profile shown in FIG. 3E is obtained, the band gap energy of each layer becomes larger than the energy of laser light and the lattice constant is not largely deviated from that of InP. As for the p$^+$-InGaAs layer 307, the In composition is set to be smaller than the lattice matching condition so that the laser light is not absorbed. As a result, tensile strain occurs. However, there is no problem in terms of crystal quality because it is sufficiently thin within a critical film thickness.

Fourth Embodiment

Figure 4A:
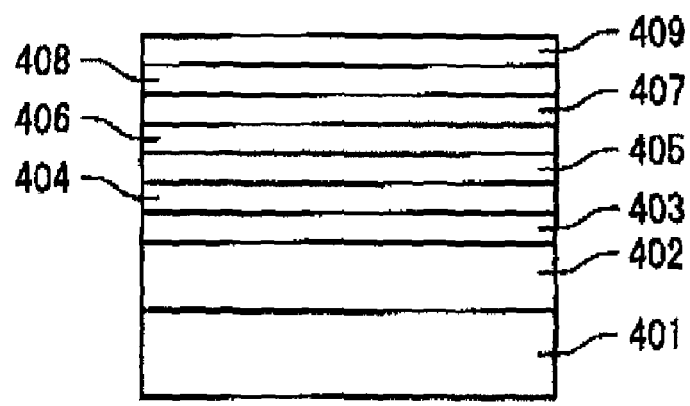
FIG. 4A is a cross-sectional view showing a manufacturing process of a tunnel junction light emitting device according to a fourth embodiment of the present invention.
Figure 4B:
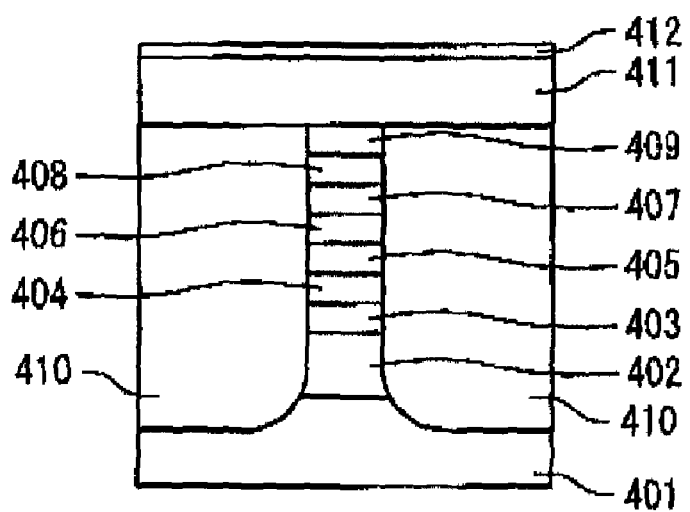
FIG. 4B is a cross-sectional view showing a manufacturing process of the tunnel junction light emitting device according to the fourth embodiment of the present invention.
Figure 4C:
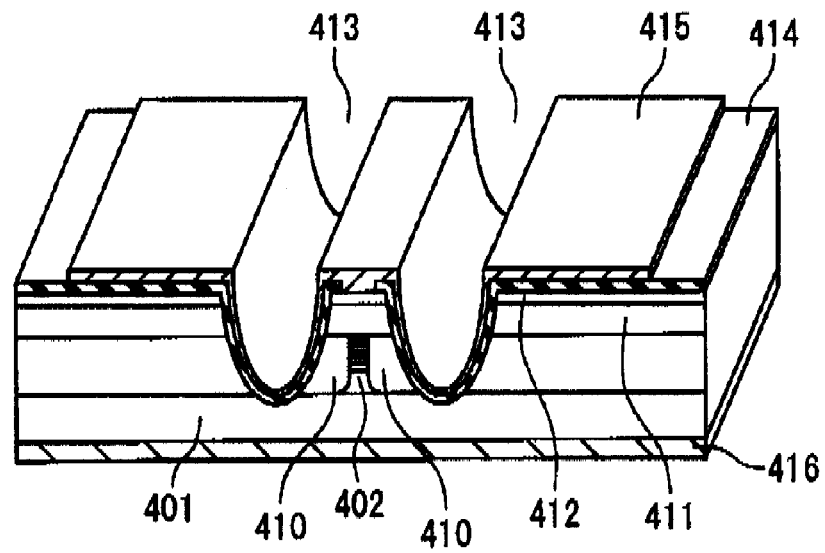
FIG. 4C is a perspective view showing a structure of the tunnel junction light emitting device according to the fourth embodiment of the present invention.

FIGS. 4A and 4B are cross-sectional views showing a manufacturing process of a tunnel junction light emitting device according to the fourth embodiment. FIG. 4C is a perspective view showing a structure of the tunnel junction light emitting device according to the fourth embodiment. In the fourth embodiment, an edge emitting type laser whose oscillation wavelength is 1.3 micrometer that is formed on a substrate 401 made of InP is explained as an example.

First, as shown in FIG. 4A, a first clad layer 402 made of n-type InP, an optical confinement layer 403 made of InGaAsP, an active layer 404 including non-doped InGaAsP quantum well and an InGaAsP barrier layer, an InGaAsP-SCH layer 405 and a clad layer 406 made of p-type InP are formed in this order on the substrate 401 made of n-InP. Moreover, a p$^+$-GaAs$_{0.6}$Sb$_{0.2}$ layer 407, a p$^+$-In$_{0.3}$Ga$_{0.7}$As layer 408 and an n$^+$-In$_{0.76}$Ga$_{0.24}$As$_{0.51}$P$_{0.49}$ layer 409 are formed in this order on the clad layer 406 (first process).

Those layers can be formed, for example, by the use of the MOCVD method. Here, C is used as p-type dopant with respect to the p$^+$-GaAs$_{0.8}$Sb$_{0.2}$ layer 407 and the p$^+$-In$_{0.3}$Ga$_{0.7}$As layer 408. On the other hand, S is used as n-type dopant with respect to the n$^+$-In$_{0.76}$Ga$_{0.24}$As$_{0.51}$P$_{0.49}$ layer 409. The p-type doping concentration for the p$^+$-GaAs$_{0.8}$Sb$_{0.2}$ layer 407 is $8 \times 10^{19}$ cm$^{-3}$. The p-type doping concentration for the p$^+$-In$_{0.3}$Ga$_{0.7}$As layer 408 is $6 \times 10^{19}$ cm$^{-3}$. The n-type doping concentration for the n-type layer 409 is $5 \times 10^9$ cm$^{-3}$ A film thickness of the p$^+$-GaAs$_{0.8}$Sb$_{0.2}$ layer 407 is 5 nm, a film thickness of the p$^+$-In$_{0.3}$Ga$_{0.7}$As layer 408 is 1.8 nm, and a film thickness of the n$^+$-In$_{0.76}$Ga$_{0.24}$As$_{0.51}$P$_{0.49}$ layer 409 is 10 nm.

Next, an SiO$_2$ film is formed by a thermal CVD method. The SiO$_2$ film is processed by using the photolithography technique and the etching technique, and a stripe pattern (SiO$_2$ stripe) made of SiO$_2$ and having a width of 2 micrometers is formed (second process). Subsequently, an etching using the SiO$_2$ stripe as a mask is carried out. As a result, as shown in FIG. 4B, a mesa structure of 2 micrometers wide including the first clad layer 402, the optical confinement layer 403, the active layer 404, the InGaAsP-SCH layer 405, the clad layer 406, the p$^+$-GaAs$_{0.8}$Sb$_{0.2}$ layer 407, the p$^+$-In$_{0.3}$Ga$_{0.7}$As layer 408 and the n$^+$-In$_{0.76}$Ga$_{0.24}$As$_{0.51}$P$_{0.49}$ layer 409 is formed (third process).

Next, Fe-doped InP is deposited by the use of the MOCVD method. Consequently, as shown in FIG. 4B, a current block layer 410 is formed to sandwich the above-described mesa structure (fourth process). Subsequently, the SiO$_2$ stripe is removed, and then a second clad layer 411 made of n-InP and a contact layer 412 made of n-InGaAs are formed (fifth process). These layers can also be formed by using the MOCVD method.

Next, as shown in FIG. 4C, two trenches 413 are formed at an interval of about 30 micrometers (sixth process). The mesa structure mentioned above is located between the two trenches 413. A depth of each trench 413 is about 4 to 5 micrometers. The trenches 413 can be formed by using the photolithography technique and the etching technique.

Next, an SiO$_2$ film 414 with a thickness of 0.4 micrometer is formed by the thermal CVD method. Also, an opening of about 20 micrometers wide is formed at the SiO$_2$ film 414 located above the mesa structure. The contact layer 412 is exposed at the opening. Subsequently, a AuGeNi alloy film and a Ti film (film thickness of 50 nm) and a Au film (film thickness of 400 nm) are formed by an evaporation method. After that, the metal thin film at a position where the devices are physically separated from each other is removed by the photolithography and ion milling. As a result, as shown in FIG. 4C, a surface electrode 415 is formed (seventh process).

Next, in order to make cleavage easy, the back-side surface of the substrate 401 is polished until the thickness of the substrate 401 becomes 100 micrometers. After that, a back electrode 416 consisting of a AuGeNi alloy film, a Ti film (film thickness of 50 nm) and a Au film (film thickness of 400 nm) is formed on the back-side surface of the substrate 401. The substrate 401 on which the tunnel junction light emitting device is formed as described above is cleaved. One surface is coated with a low reflection film while the other surface is coated with a high reflection film. After that, every chip sections are carved out and the edge emitting type laser according to the present embodiment is completed (eighth process).

Figure 4D:
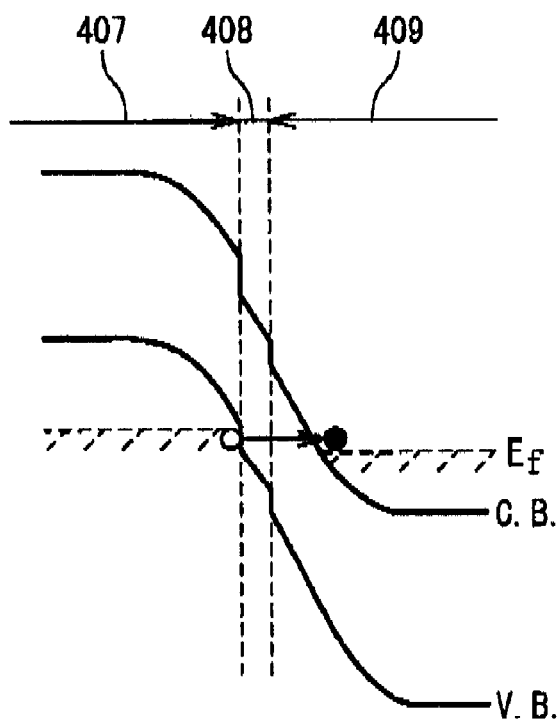
FIG. 4D is an energy band diagram of an electron tunneling region according to the fourth embodiment of the present invention.

According to the present embodiment, the p$^+$-GaAs$_{0.8}$Sb$_{0.2}$ layer 407, the p$^+$-In$_{0.3}$Ga$_{0.7}$As layer 408 and the n$^+$-In$_{0.76}$Ga$_{0.24}$As$_{0.51}$P$_{0.49}$ layer 409 form a tunnel junction and constitute a section (the electron tunneling region) through which electrons tunnel. The energy band of the electron tunneling region according to the present embodiment is as shown in FIG. 4D. According to the present embodiment, the resistance of the tunnel junction light emitting device is reduced, as in the foregoing embodiments.

Let us compare the laser structure according to the present embodiment with a conventional laser structure in which the whole upper part of the active layer is p-type semiconductors. With regard to the structure according to the present embodiment, the most of the clad layer 406 above the active layer 404 can be replaced with an n-type layer. Since the resistance of n-type semiconductor is lower as compared with that of p-type semiconductor, it is possible in the present embodiment to reduce the resistance as a whole even when the resistance of the electron tunneling section is considered. Also, in the section other than the electron tunneling section, the tunneling probability is extremely low and thus current scarcely flows. Therefore, according to the tunnel junction light emitting device of the present embodiment, it is possible to reduce a leakage current as compared with the conventional technique. It should be noted that an optical-absorption coefficient of the electron tunneling section is comparatively large due to the high doping concentration. However, since an optical-absorption coefficient of the n-type semiconductor is smaller than that of the p-type semiconductor, the optical-absorption coefficient in the clad layer becomes smaller as compared with the conventional structure.

Fifth Embodiment

Figure 5A:
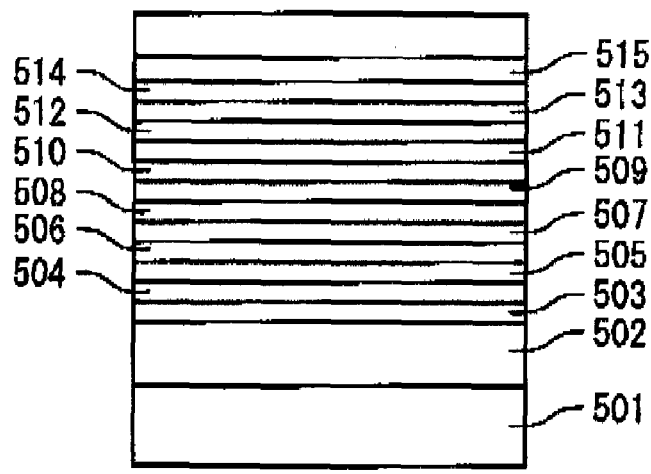
FIG. 5A is a cross-sectional view showing a manufacturing process of a tunnel junction light emitting device according to a fifth embodiment of the present invention.
Figure 5B:
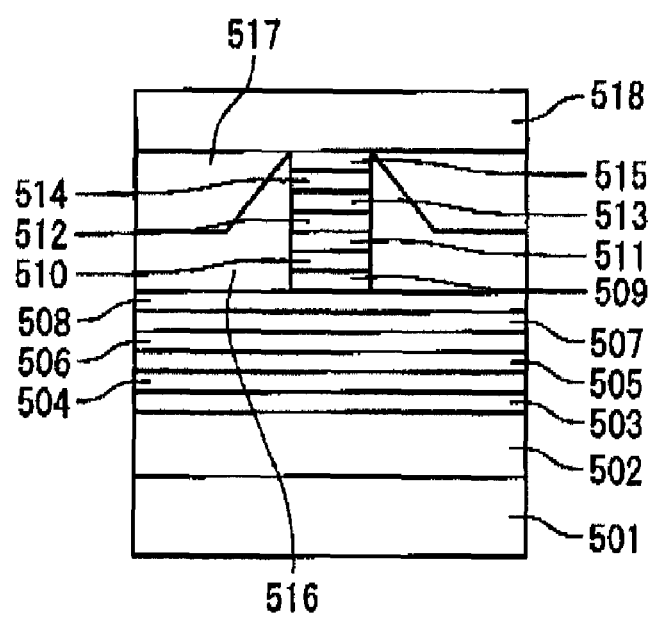
FIG. 5B is a cross-sectional view showing a manufacturing process of the tunnel junction light emitting device according to the fifth embodiment of the present invention.
Figure 5C:
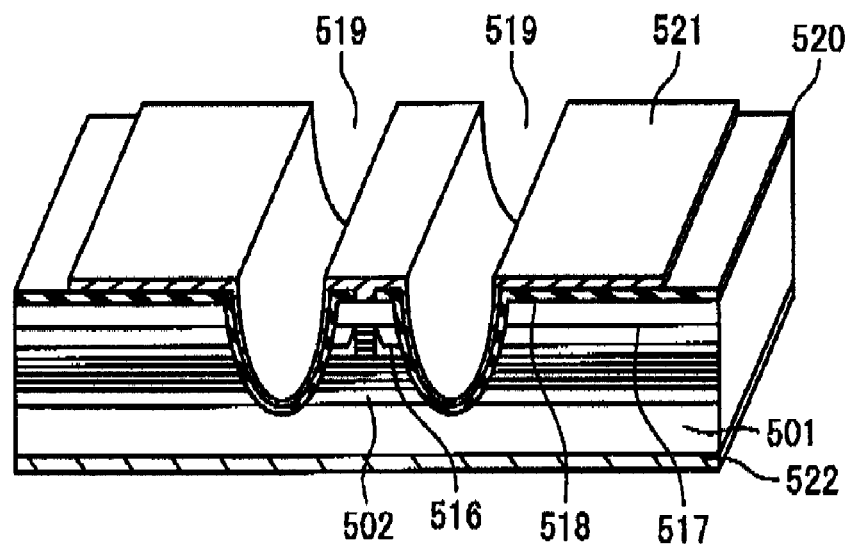
FIG. 5C is a perspective view showing a structure of the tunnel junction light emitting device according to the fifth embodiment of the present invention.

FIGS. 5A and 5S are cross-sectional views showing a manufacturing process of a tunnel junction light emitting device according to the fifth embodiment. FIG. 5C is a perspective view showing a structure of the tunnel junction light emitting device according to the fifth embodiment. In the fifth embodiment, an edge emitting type laser whose oscillation wavelength is 0.98 micrometer that is formed on a substrate 501 made of GaAs is explained as an example.

First, as shown in FIG. 5A, a first clad layer 502 made of n-type $Al_{0.35}Ga_{0.65}As$, a second clad layer 503 made of n-type $Al_{0.2}Ga_{0.8}As$, an optical confinement layer 504 made of GaAs, an active layer 505 including non-doped InGaAs quantum well and a GaAs barrier layer, an optical confinement layer 506 made of GaAs, a clad layer 507 made of p-type GaAs, and an etching stop layer 508 made of p-type $Al_{0.35}Ga_{0.65}As$ are formed in this order on the substrate 501 made of n-GaAs. Moreover, a $p^+$-$Al_{0.2}Ga_{0.8}As_{0.85}Sb_{0.15}$ layer 509, a $p^+$-$Al_{0.2}Ga_{0.8}As_{0.98}N_{0.02}$ layer 510 and an $n^+$-$Al_{0.2}Ga_{0.7}In_{0.1}As_{0.96}N_{0.02}$ layer 511 are formed in this order on the etching stop layer 508. Furthermore, an n-GaAs layer 512, an n-$Al_{0.2}Ga_{0.8}As$ layer 513, an n-$Al_{0.35}Ga_{0.65}As$ layer 514 and an n-GaAs layer 515, which are n-type layers, are formed in this order thereon (first process).

Here, c is used as p-type dopant with respect to the $p^+$-$Al_{0.2}Ga_{0.8}As_{0.85}Sb_{0.15}$ layer 509 and the $p^+$-$Al_{0.2}Ga_{0.6}As_{0.98}$ layer 510. On the other hand, Se is used as n-type dopant with respect to the $n^+Al_{0.2}Ga_{0.7}In_{0.1}As_{0.98}N_{0.02}$ layer 511. The p-type doping concentration for the $p^+$-$Al_{0.2}Ga_{0.5}As_{0.85}Sb_{0.15}$ layer 509 is $1 \times 10^{20}$ cm$^{-3}$. The p-type doping concentration for the $p^+$-$Al_{0.2}Ga_{0.8}As_{0.98}N_{0.02}$ layer 510 is $1 \times 10^{20}$ cm$^{-1}$. The n-type doping concentration for the n-type layer 511 is $5 \times 10^{19}$ cm$^{-3}$. A film thickness of the $p^+$-$Al_{0.2}Ga_{0.8}As_{0.85}Sb_{0.15}$ layer 509 is 5 nm, a film thickness of the $p^+$-$Al_{0.2}Ga_{0.8}As_{0.98}N_{0.02}$ layer 510 is 1.3 nm, and a film thickness of the $n^+$-$Al_{0.2}Ga_{0.7}In_{0.1}As_{0.98}N_{0.02}$ layer 511 is 10 nm.

Next, an $SiO_2$ film is formed by the thermal CVD method. The $SiO_2$ film is processed by using the photolithography technique and the etching technique, and a stripe pattern ($SiO_2$ stripe) having a width of 2 micrometers is formed (second process). Next, an etching using the $SiO_2$ stripe as a mask is carried out. As a result, as shown in FIG. 5B, a mesa structure of 2 micrometers wide including the $p^+$-$Al_{0.02}Ga_{0.8}As_{0.85}Sb_{0.15}$ layer 509, the $p^+$-$Al_{0.2}Ga_{0.8}As_{0.98}N_{0.02}$ layer 510, the $n^+$-$Al_{0.2}Ga_{0.7}In_{0.1}As_{0.98}N_{0.02}$ layer 511, the n-GaAs layer 512, the n-$Al_{0.2}Ga_{0.8}As$ layer 513, the n-$Al_{0.35}Ga_{0.65}As$ layer 514 and the n-GaAs layer 515 is formed (third process). The etching is stopped at the etching stop layer 508.

Next, a selective growth process is carried out by using the above-mentioned $SiO_2$ stripe as a mask. As a result, as shown in FIG. 5B, a current block layer consisting of a p-$Al_{0.3}Ga_{0.7}As$ layer 516 and a p-GaAs layer 517 is formed (fourth process). Subsequently, the $SiO_2$ stripe used as the mask is removed. After that, an n-GaAs layer 518 is formed on the above-mentioned mesa structure and the current block layer by the use of the MOCVD method (fifth process).

Next, a ZnO film is deposited by using the sputtering method. The ZnO film is processed by the photolithography technique and the etching technique, and thereby a ZnO stripe that has a width of 60 micrometers and a pitch of 1200 micrometers is formed (sixth process). The ZnO stripe is so formed as to extend in a direction orthogonal to the above-described $SiO_2$ stripe.

After the ZnO stripe is formed, a heat treatment is performed in $N_2$ gas atmosphere at 500 degrees centigrade for 40 minutes (seventh process). Due to the heat treatment, Zn diffuses into a region below the ZnO stripe. By the Zn that diffuses to the active layer 505 in this manner, the quantum well structure in the active layer 505 is broken and bulked. The band gap is increased in the bulked region. Therefore, the bulked region does not function as the active layer. The bulked region serves as a window region that does not absorb the laser light emitted from the active layer 505 in the region into which Zn is not diffused. Moreover, due to the Zn diffusion, the associated region within the electron tunneling section does not function. Thus, the current is not injected into such the region.

Next, the above-mentioned ZnO stripe is removed. Subsequently, as shown in FIG. 5C, two trenches 519 are formed at an interval of about 30 micrometers by the photolithography technique and the etching technique (eighth process). The mesa structure mentioned above is located between the two trenches 519. A depth of each trench 413 is about 4 to 5 micrometers.

Next, an $SiO_3$ film 520 with a thickness of 0.4 micrometer is formed by the thermal CVD method. Also, an opening of about 20 micrometers wide is formed at the $SiO_2$ film 520 located above the mesa structure. The n-GaAs layer 51e is exposed at the opening (eighth process). Subsequently, a AuGeNi alloy film and a Ti film (film thickness of 50 nm) and a Au film (film thickness of 400 nm) are formed by the evaporation method. After that, the metal thin film at a position where the devices will be physically separated from each other is removed by the photolithography and the ion milling. As a result, as shown in FIG. 5C, a surface electrode 521 is formed (ninth process).

Next, in order to make cleavage easy, the back-side surface of the substrate 501 is polished until the thickness of the substrate 501 becomes 100 micrometers. After that, a back electrode 522 consisting of a AuGeNi alloy film, a Ti film (film thickness of 50 nm) and a Au film (film thickness of 400 nm) is formed on the back-side surface of the substrate 501 (tenth process). The substrate 501 on which the tunnel junction light emitting device is formed as described above is cleaved at a pitch of 1200 micrometers in the resonance direction (eleventh process). The cleavage position is the center of the region having a width of 60 micrometers into which the Zn is diffused in the sixth process. Consequently, both end sections of 30 micrometers of the cavity length of 1200 micrometers respectively become the window structures. Therefore, catastrophic optical damage (COD) at the end sections hardly occurs and it is thus possible to increase the maximum output. One surface of an LD bar thus cleaved is coated with a low reflection film while the other surface is coated with a high reflection film. After that, carved out one by one, and the edge emitting type laser according to the present embodiment is completed (twelfth process).

Figure 5D:
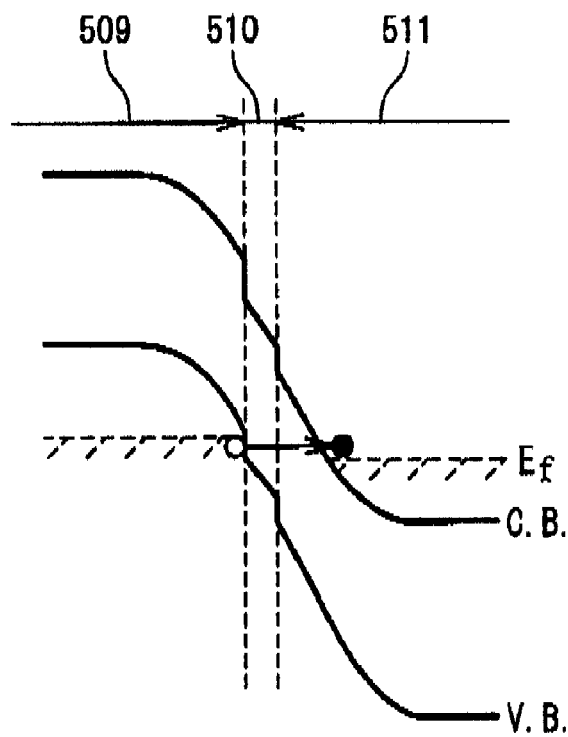
FIG. 5D is an energy band diagram of an electron tunneling region according to the fifth embodiment of the present invention.

According to the present embodiment, the $p^+$-$Al_{0.2}Ga_{0.9}As_{0.85}Sb_{0.15}$ layer 509, the $p^+$-$Al_{0.2}Ga_{0.8}As_{0.96}N_{0.02}$ layer 510, and the $n^+$-$Al_{0.2}Ga_{0.7}In_{0.1}As_{0.98}N_{0.02}$ layer 511 form a tunnel junction and constitute a section (the electron tunneling region) through which electrons tunnel. The energy band of the electron tunneling region according to the present embodiment is as shown in FIG. 5D. According to the present embodiment, the resistance of the tunnel junction light emitting device is reduced, as in the foregoing embodiments.

Sixth Embodiment

Figure 6A:
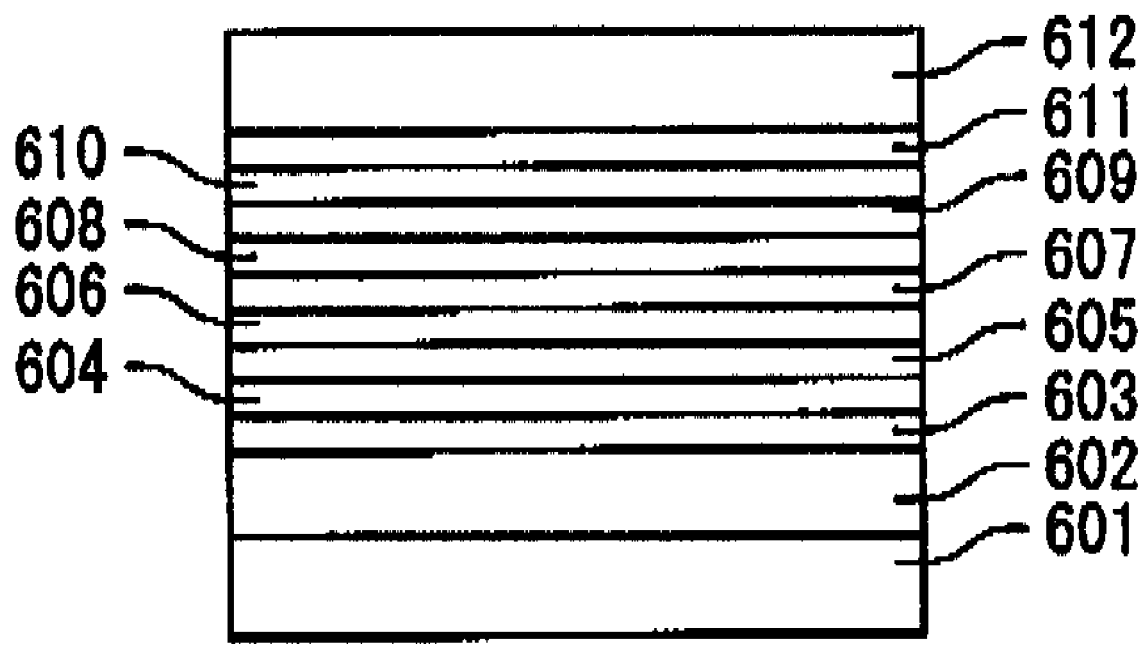
FIG. 6A is a cross-sectional view showing a manufacturing process of a tunnel junction light emitting device according to a sixth embodiment of the present invention.
Figure 6B:
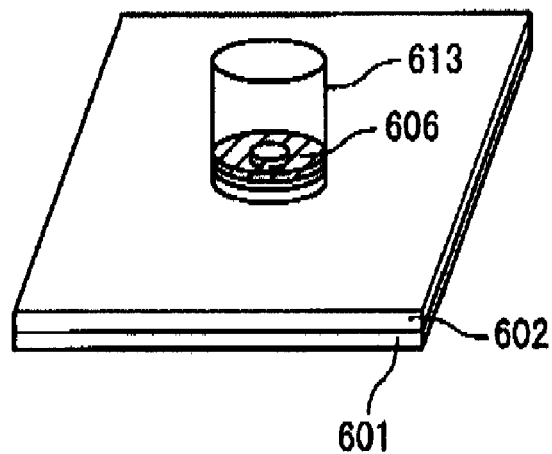
FIG. 6B is a cross-sectional view showing a manufacturing process of the tunnel junction light emitting device according to the sixth embodiment of the present invention.
Figure 6C:
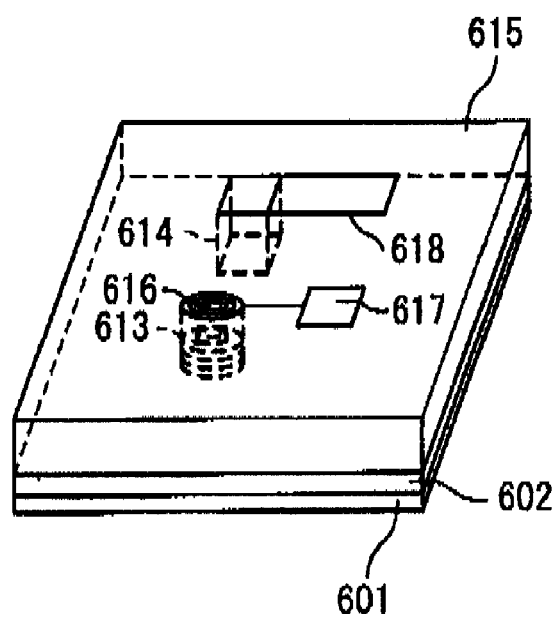
FIG. 6C is a perspective view showing a structure of the tunnel junction light emitting device according to the sixth embodiment of the present invention.

FIGS. 6A and 6B are cross-sectional views showing a manufacturing process of a tunnel junction light emitting device according to the sixth embodiment. FIG. 6C is a perspective view showing a structure of the tunnel junction light emitting device according to the sixth embodiment. In the sixth embodiment, a vertical cavity surface emitting laser whose oscillation wavelength is 0.92 micrometer that is formed on a substrate 601 made of GaAs is explained as an example.

First, as shown in FIG. 6A, a first DBR layer 602 is formed on the substrate 601 made of n-type GaAs. The first DBR layer 602 consists of a plurality of DBRs, where each DBR (n-type semiconductor mirror layer) as a basic unit is constituted by a pair of an n-type GaAs layer and an n-type $Al_{0.9}Ga_{0.1}As$ layer. A clad layer 603 made of n-type $Al_{0.2}Ga_{0.7}As$, an active layer 604 including non-doped $In_{0.15}Ga_{0.95}As$ quantum well and an $Al_{0.2}Ga_{0.8}As$ barrier layer, a clad layer 605 made of p-type $Al_{0.3}Ga_{0.7}As$ layer, and an oxide layer formation layer 606 made of p-type $Al_xGa_{1-x}As$ (0.9<x<1) are formed in this order on the first DBR layer 602. Moreover, a p-GaAs layer 607, a $p^+$-GaAs layer 608, a $p^+$-$Al_{0.2}Ga_{0.8}As_{0.99}N_{0.01}$ layer 609, an $n^+$-GaAs layer 610, and an n-GaAs layer 611 are formed in this order on the oxide layer formation layer 606. Furthermore, a second DBR layer 612 is formed on the n-GaAs layer 611. In the second DBR layer 612, a plurality of DBRs are formed, and each of the DBRs (n-type semiconductor mirror layer) as a basic unit is constituted by a pair of an n-type GaAs layer and an n-type $Al_{0.9}Ga_{0.1}As$ layer (first process).

Those layers can be formed, for example, by using the metal organic chemical vapor deposition method. Here, C is used as p-type dopant with respect to the $p^+$-GaAs layer 608 and the $p^+$-$Al_{0.2}Ga_{0.8}As_{0.99}N_{0.01}$ layer 609. On the other hand, S is used as the dopant with respect to the $n^+$-GaAs layer 610. Also, the p-type doping concentration for the $p^+$-GaAs layer 608 is $1 \times 10^{20}$ $cm^{-3}$. The p-type doping concentration for the $p^+$-$Al_{0.2}Ga_{0.8}As_{0.99}N_{0.01}$ layer 609 is $1.5 \times 10^{20}$ $cm^{-3}$ that is higher than for the $p^+$-GaAs layer 608. The n-type doping concentration for the $n^+$-GaAs layer 610 is $5 \times 10^{19}$ $cm^{-3}$. A film thickness of the $p^+$-GaAs layer 608 is 5 nm, a film thickness of the $p^+$-$Al_{0.2}Ga_{0.8}As_{0.99}N_{0.01}$ layer 609 is 1.3 nm, and a film thickness of the $n^+$-GaAs layer 610 is 10 nm.

Next, a dielectric film is deposited on the second DBR layer 612. Then, a circular dielectric pattern of 20 micrometers in diameter is formed by the photolithography technique and the etching. Subsequently, a dry etching using the dielectric pattern as a mask is carried out. As a result, as shown in FIG. 6B, a columnar structure 613 of about 20 micrometers in diameter that reaches the first DBR layer 602 is formed (second process). Due to the process, a side surface of the oxide layer formation layer 606 is exposed. After that, the dielectric pattern is removed.

Next, a heat treatment is performed in water vapor atmosphere at a temperature of about 400 degrees centigrade for about 10 minutes (third process). As a result, only the oxide layer formation layer 606 is selectively and annularly oxidized. The oxidation condition is controlled such that a non-oxidized region of about 5 micrometers in diameter remains at the center of the oxide layer formation layer 606.

Next, as shown in FIG. 6C, an electrode 614 is formed on the first DBR layer 602 that is exposed in the second process. More specifically, resist is first applied to the entire region. Then, a portion where the electrode is formed is removed by the lithography to form a resist pattern. After a Ti/Pt/Au film is deposited, the resist pattern is removed and a liftoff is carried out. As a result, the electrode 614 is formed on a part of the first DBR layer 602 (fourth process). Next, as shown in FIG. 6C, polyimide resin is applied and a polyimide layer 615 is formed. Subsequently, the lithography technique is used to remove the polyimide on the columnar structure 613 formed in the second process and on the electrode 614 formed in the fourth process (fifth process).

Figure 6D:
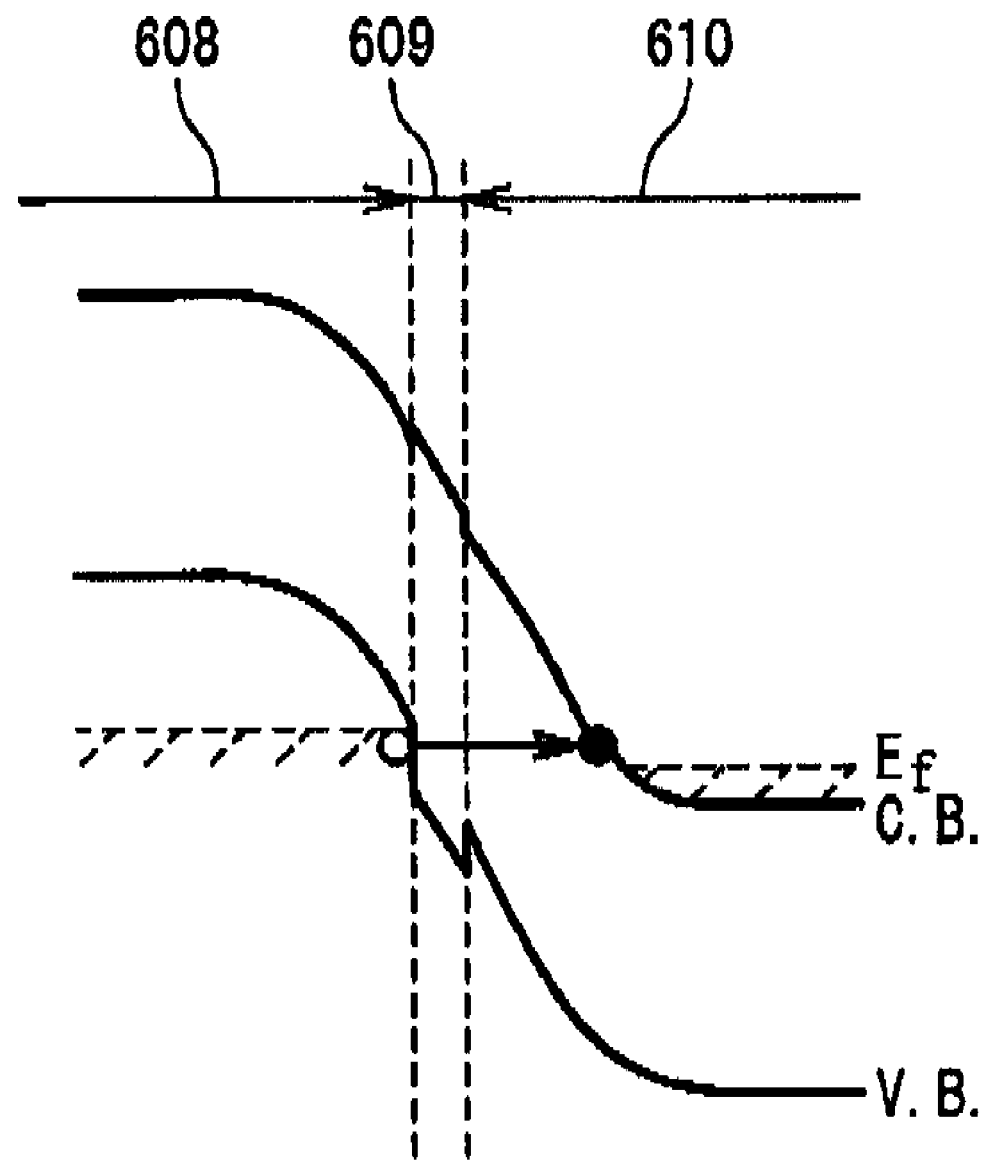
FIG. 6D is an energy band diagram of an electron tunneling region according to the sixth embodiment of the present invention.

Next, photo resist is applied and a resist pattern having a predetermined pattern is formed. After that, a Ti/Pt/Au film is deposited. Subsequently, the resist pattern is removed and a lift-off is carried out. As a result, as shown in FIG. 6D, a ring-shaped electrode 616 and a pad electrode 617 connected to the ring-shaped electrode 616 are formed. At the same time, a pad electrode 618 connected to the electrode 614 on the first DBR is formed on the polyimide (sixth process).

The VCSELs formed on the GaAs substrate as described above are carved out one by one or in a desired array shape (for example, 1×10, 100×100 or the like) and used.

According to the present embodiment, the $p^+$-GaAs layer 608, the $p^+$-$Al_{0.2}Ga_{0.8}As_{0.99}N_{0.01}$ layer 609 and the $n^+$-GaAs layer 610 form a tunnel junction and constitute a section (the electron tunneling region) through which electrons tunnel. The doping concentration for the $p^+$-$Al_{0.2}Ga_{0.8}As_{0.99}N_{0.01}$ layer 609 is higher than the doping density for the $p^+$-GaAs layer 608. Therefore, a depletion layer on the p-side becomes smaller as compared with a tunnel junction constituted by a homojunction of GaAs.

The energy band of the electron tunneling region according to the present embodiment is as shown in FIG. 6D. A reverse bias is applied to the tunnel junction. As shown in FIG. 6D, an energy level at the conduction band edge of the p-type layer 609 is slightly higher than an energy level at the conduction band edge of the p-type layer 608, and hence the barrier through which electrons need to tunnel becomes slightly higher. However, as compared with such the effect, an effect of reduction of a tunnel barrier width resulting from the reduction of the above-mentioned depletion layer is larger. Therefore, the tunneling probability according to the present embodiment is higher as compared with a tunnel junction constituted by a homojunction of GaAs.

Also, according to the present embodiment, a thickness of the $p^+$-$Al_{0.2}Ga_{0.8}As_{0.99}N_{0.01}$ layer 609 is designed to be between the p-n junction interface and a position at which the quasi-Fermi level (Ef) and the valence band (V.B.) edge intersect with each other. The $p^+$-GaAs layer 608, in which the energy level at the valence band edge is higher than that of the p-type layer 609, is adjacent to the p-type layer 609 and serves as a source of the electron tunneling. Consequently, the height of the tunnel barrier is reduced as compared with a case where the tunnel junction is constituted by only the $Al_{0.2}Ga_{0.8}As_{0.99}N_{0.01}$ layer 609 and the $n^+$-GaAs layer 610.

As a result, the tunneling probability is increased and a large current flows with a low voltage. That is to say, the resistance is reduced according to the tunnel junction light emitting device of the present embodiment.

It should be noted in the present embodiment that the current confinement is not achieved by the electron tunneling section, which is different from the foregoing embodiments. The p-type $Al_xGa_{1-x}As$ (0.9<x<1) oxide layer 606 that is closer to the active layer 604 than the electron tunneling section plays a role of confining the current.

(Action and Effect)

Figure 7A:
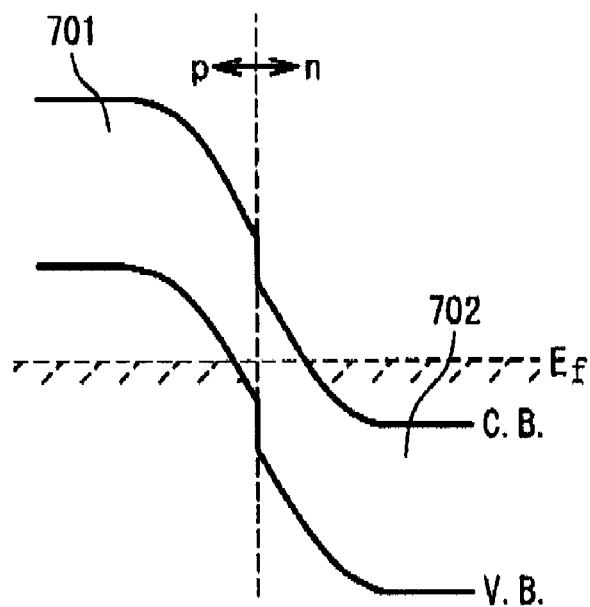
FIG. 7A is a diagram for explaining actions and effects of the present invention and is an energy band diagram according to a conventional technique.
Figure 7B:
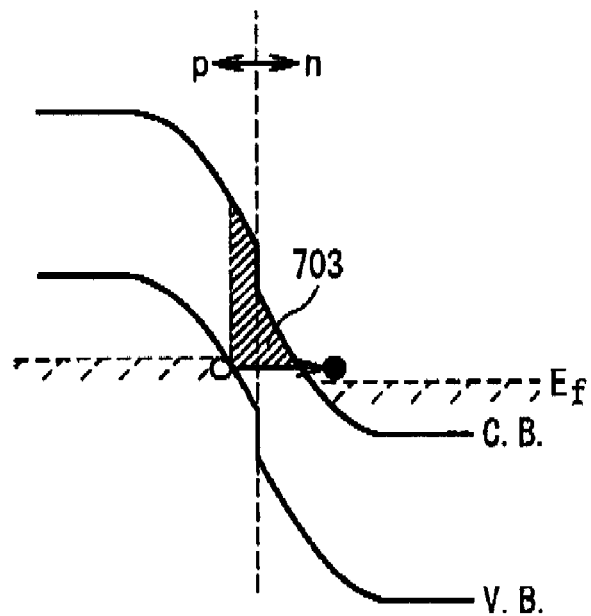
FIG. 7B is a diagram for explaining actions and effects of the present invention and is an energy band diagram according to a conventional technique.

The action and effects of the present invention will be described and summarized below. As a comparative example, FIG. 7A shows an energy band state in the case of the conventional Type-II tunnel junction described in Japanese Laid Open Patent Application (JP-P2002-134835A). In the case of FIG. 7A, electrons tunnel from a p-type semiconductor 701 to an n-type semiconductor 702. The barrier through which electrons need to tunnel in this case is indicated by a shaded portion 703 in FIG. 7B.

Figure 7C:
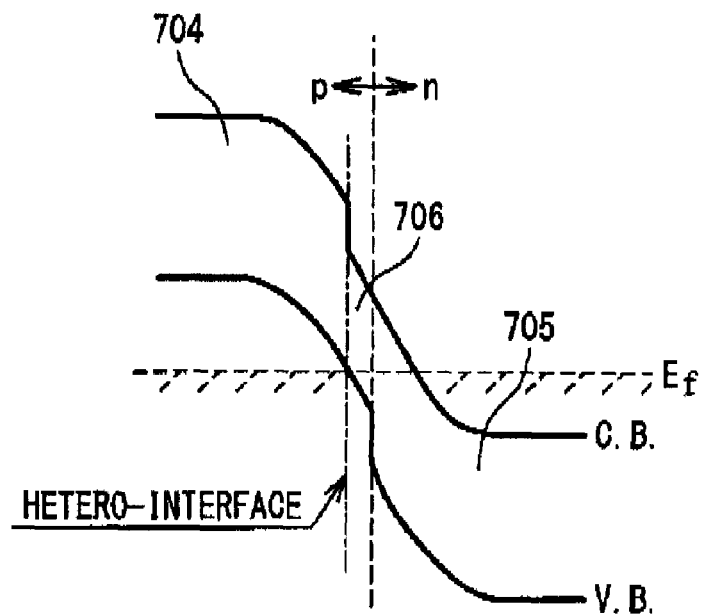
FIG. 7C is an energy band diagram of the electron tunneling region according to an embodiment of the present invention.
Figure 7D:
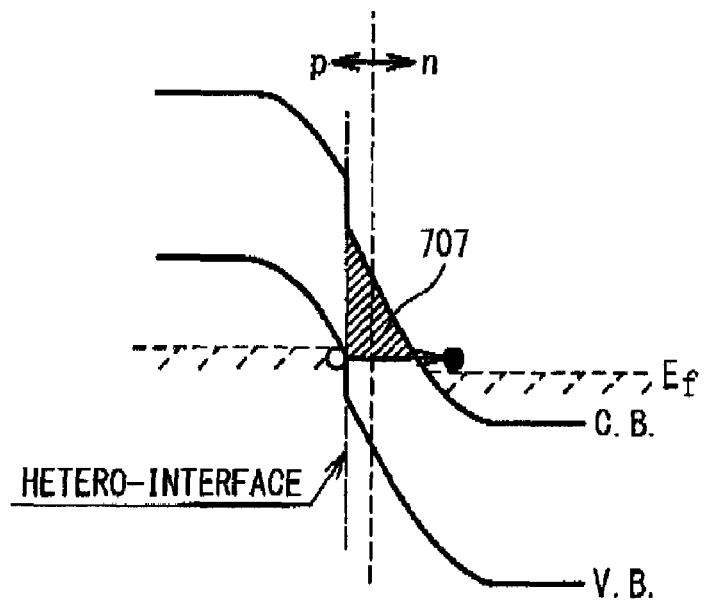
FIG. 7D is an energy band diagram of the electron tunneling region according to an embodiment of the present invention.

On the other hand, according to an embodiment of the present invention, the electron tunneling region is provided with at least a first p-type semiconductor layer and a second p-type semiconductor layer that is different in kinds from the first p-type semiconductor layer. For example, energy levels at the valence band edge and the conduction band edge of the second p-type semiconductor layer are respectively lower than those of the first p-type semiconductor layer that serves as the source of the electron tunneling. An energy band state in this case is shown in FIG. 7C. In FIG. 7C, the second p-type semiconductor layer 706 whose energy levels at the valence band (V.B.) edge and the conduction band (C.B.) edge are respectively lower than those of the first p-type semiconductor layer 704 is sandwiched between the first p-type semiconductor layer 704 and an n-type semiconductor layer 705. The barrier through which electrons need to tunnel in this case is indicated by a shaded portion 707 in FIG. 7D. As can be understood from a comparison between the shaded portion 703 in FIG. 7B and the shaded portion 707 in FIG. 7D, the height of the tunnel barrier in the p-type semiconductor layer can be suppressed according to the embodiment of the present invention. Therefore, the tunneling probability is increased, and a large current flows with a low voltage. That is to say, the resistance can be reduced according to the tunnel junction light emitting device of the embodiment.

Figure 8:
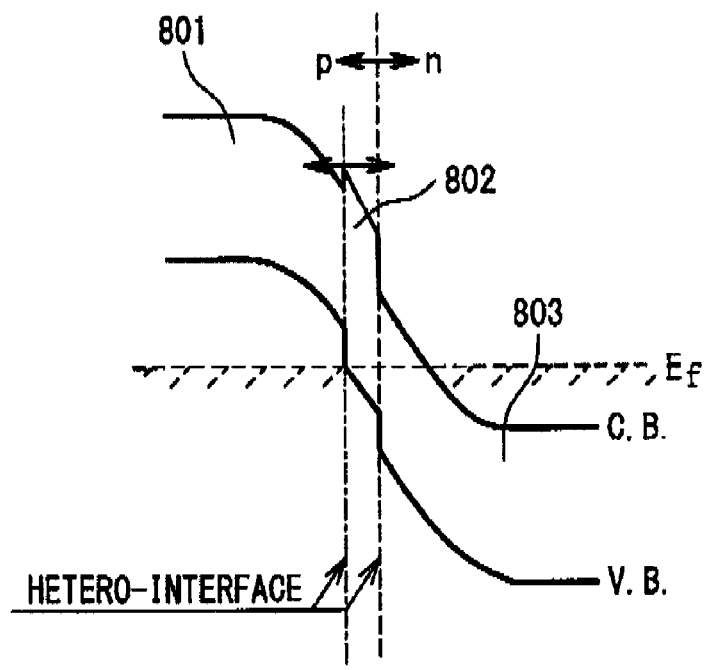
FIG. 8 is an energy band diagram of the electron tunneling region according to another embodiment of the present invention.

According to an embodiment of the present invention, the electron tunneling region may be provided with a second p-type semiconductor layer in which the doping concentration is higher than that in a first p-type semiconductor layer serving as the source of the electron tunneling (refer to the sixth embodiment). In FIG. 8 for example, the second p-type semiconductor layer 802 in which the energy level at the valence band (V.B.) edge is lower and the doping concentration is higher than that of the first p-type semiconductor layer 801 is sandwiched between the first p-type semiconductor layer 801 and an n-type semiconductor layer 803. In this case, the thickness of the depletion layer within the p-type semiconductor layer can be suppressed. Therefore, the energy level at the conduction band (C.B.) edge of the second p-type semiconductor layer 802 can be higher than that of the first p-type semiconductor layer 801. If the effect of increase in the barrier height due to this is surpassed by the effect of reduction of the depletion layer thickness, the tunneling probability is increased. As a result, the resistance can be reduced.

Figure 9:
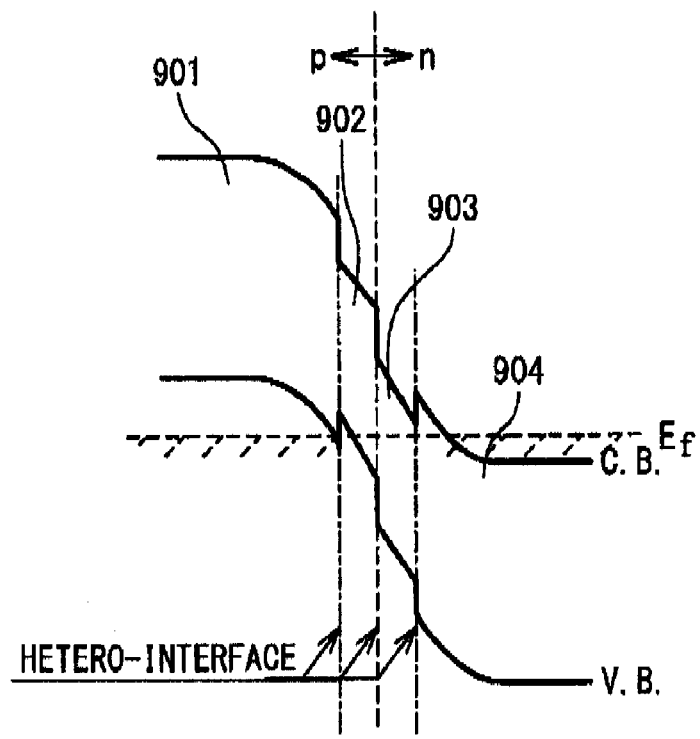
FIG. 9 is an energy band diagram showing an example of an improper hetero-junction.

A lot of other combinations may be conceivable with regard to the tunnel junction in which the p-type semiconductor layer is constituted by two or more kinds of semiconductors. In FIG. 9, for example, a p-type semiconductor layer 902 in which the energy level at the valence band edge is higher as compared with a p-type semiconductor layer 901 serving as the source of the tunneling is provided (refer to the above-mentioned Japanese Laid open Patent Application JP-P2004-336039A). In addition to that, n-type semiconductor layers 903 and 904 are provided. However, according to the structure shown in FIG. 9, the barrier becomes larger and the tunneling probability becomes lower as compared with a tunnel junction consisting only of the p-type semiconductor layer 902 and the n-type semiconductor layer 903. Therefore, the structure shown in FIG. 9 is inappropriate.

Also in FIG. 8, if the energy level at the valence band edge of the second p-type semiconductor layer 802 is higher than that of the first p-type semiconductor layer 801, the tunneling probability becomes lower as compared with a tunnel junction consisting only of the second p-type semiconductor layer 802 and the n-type semiconductor layer 803. Thus, even if the p-type semiconductor layer is constituted by two or more kinds of semiconductors, the tunneling probability is not always increased. In order to increase the tunneling probability by providing two or more kinds of p-type semiconductors, it is necessary that the second p-type semiconductor layer in which the energy level at the valence band edge is equal to or lower than that of the first p-type semiconductor layer is provided in the electron tunneling region.

As described above, it is preferable in the present invention that a compound semiconductor in which the energy level at the valence band edge is high and the energy level at the conduction band edge is relatively high is used as the first p-type semiconductor layer that serves as the source of the tunneling. The compound semiconductor having such the band structure is exemplified by a compound semiconductor including Sb and/or P, as in the above-described embodiments. It is preferable that the concentration of the element increases from the p-n interface towards the p-type layer direction. On the other hand, it is preferable that a compound semiconductor in which the energy level at the conduction band edge is low and the energy level at the valence band edge is relatively low is used as the second p-type semiconductor layer other than the source of the tunneling. The compound semiconductor having such the band structure is exemplified by a compound semiconductor including In and/or N, as in the above-described embodiments.

It is also preferable in the present invention that the energy level at the valence band edge of the second p-type semiconductor layer is equal to or lower than that of the first p-type semiconductor layer and the energy level at the conduction band edge of the second p-type semiconductor layer is lower than the energy level at the conduction band edge of the first p-type semiconductor layer. In other words, it is preferable that a so-called Type-II hetero-junction is formed in the p-type semiconductor layer.

Also, in order to reduce the resistance by applying the tunnel junction, the tunneling probability needs to be sufficiently high. Thus, the tunneling region needs to be sufficiently thin. It is therefore preferable that the thickness of the second p-type semiconductor layer other than the layer serving as the source of the tunneling is equal to or less than 5 nm, as exemplified in the above-described embodiments.

Also, in order to further increase the tunneling probability, it is desirable that the energy levels at the conduction band edge and the valence band edge of the first p-type semiconductor layer are respectively higher than the energy levels at the conduction band edge and the valence band edge of the n-type semiconductor layer. It is also possible to configure the n-type semiconductor layer with two or more kinds of semiconductors as the case may be.

Embodiments of the present invention are not limited to the above-described various embodiments. The tunnel junction light emitting device according to the present invention can be similarly applied to a light emitting diode (LED) as well as the semiconductor laser. Also, as for the wavelength and the material of the tunnel junction light emitting device, those other than the above-described examples can be selected. Moreover, the composition can be changed gradually, although the composition is changed in a stepwise fashion in the above-described embodiments.

The invention claimed is:

1. A tunnel junction light emitting device comprising:
an active layer; and
an electron tunneling region supplying said active layer with carriers,
wherein said electron tunneling region has:
a first p-type semiconductor layer;
a second p-type semiconductor layer; and
an n-type semiconductor layer,
wherein said second p-type semiconductor layer is sandwiched between said first p-type semiconductor layer and said n-type semiconductor layer,
wherein said first p-type semiconductor layer, said second p-type semiconductor layer and said n-type semiconductor layer form a tunnel junction to which a reverse bias is applied,
wherein an energy level at a valence band edge of said second p-type semiconductor layer is equal to or lower than an energy level at a valence band edge of said first p-type semiconductor layer.

2. The tunnel junction light emitting device according to claim 1,
wherein an energy level at a conduction band edge of said second p-type semiconductor layer is lower than an energy level at a conduction band edge of said first p-type semiconductor layer.

3. The tunnel junction light emitting device according to claim 1,
wherein doping concentration in said second p-type semiconductor layer is higher than doping concentration in said first p-type semiconductor layer.

4. The tunnel junction light emitting device according to claim 1,
wherein an energy level at a conduction band edge of said first p-type semiconductor layer is higher than an energy level at a conduction band edge of said n-type semiconductor layer.

5. The tunnel junction light emitting device according to claim 1,
wherein an energy level at a valence band edge of said first p-type semiconductor layer is higher than an energy level at a valence band edge of said n-type semiconductor layer.

6. The tunnel junction light emitting device according to claim 1,
wherein a thickness of said second p-type semiconductor layer is less than 5 nm.

7. The tunnel junction light emitting device according to claim 1:
wherein a thickness of said second p-type semiconductor layer is less than 5 nm.

8. The tunnel junction light emitting device according to claim 1:
wherein at least a part of said p-type semiconductor layer is made of compound semiconductor including at least one of Sb and P, and concentration of the element increases from a p-n interface towards a p-type layer direction.

9. The tunnel junction light emitting device according to claim 2:
wherein at least a part of said p-type semiconductor layer is made of compound semiconductor including at least one of In and N, and concentration of the element decreases from a p-n interface towards a p-type layer direction.

10. The tunnel junction light emitting device according to claim 1,
wherein the tunnel junction light emitting device is a vertical cavity surface emitting laser.

11. The tunnel junction light emitting device according to claim 2,
wherein an energy level at a conduction band edge of said first p-type semiconductor layer is higher than an energy level at a conduction band edge of said n-type semiconductor layer.

12. The tunnel junction light emitting device according to claim 2,
wherein an energy level at a valence band edge of said first p-type semiconductor layer is higher than an energy level at a valence band edge of said n-type semiconductor layer.

13. The tunnel junction light emitting device according to claim 2,
wherein a thickness of said second p-type semiconductor layer is less than 5 nm.

14. The tunnel junction light emitting device according to claim 3,
wherein an energy level at a conduction band edge of said first p-type semiconductor layer is higher than an energy level at a conduction band edge of said n-type semiconductor layer.

15. The tunnel junction light emitting device according to claim 3,
wherein an energy level at a valence band edge of said first p-type semiconductor layer is higher than an energy level at a valence band edge of said n-type semiconductor layer.

16. The tunnel junction light emitting device according to claim 3,
wherein a thickness of said second p-type semiconductor layer is less than 5 nm.

17. The tunnel junction light emitting device according to claim 2,
wherein the tunnel junction light emitting device is a vertical cavity surface emitting laser.

18. The tunnel junction light emitting device according to claim 4,
wherein the tunnel junction light emitting device is a vertical cavity surface emitting laser.

19. The tunnel junction light emitting device according to claim 5,
wherein the tunnel junction light emitting device is a vertical cavity surface emitting laser.

* * * * *

UNITED STATES PATENT AND TRADEMARK OFFICE
CERTIFICATE OF CORRECTION

PATENT NO. : 7,638,792 B2
APPLICATION NO. : 11/909229
DATED : December 29, 2009
INVENTOR(S) : Naofumi Suzuki It is certified that error appears in the above-identified patent and that said Letters Patent is hereby corrected as shown below:

Column 5, line 64, delete "GaInAs" and insert --GaInNAs--.

Column 6, line 12, delete "$p^+$-$Ga_{0.9}In_{0.01}N_{0.002}AS_{0.098}$" and insert --$p^+$-$Ga_{0.9}In_{0.1}N_{0.02}AS_{0.098}$--.

Column 6, line 18, delete "$n^+$-$Ga_{0.9}In_{0.01}N_{0.02}AS_{0.098}$" and insert --$n^+$-$Ga_{0.9}In_{0.1}N_{0.02}AS_{0.098}$--.

Column 7, line 32, delete "$Ga_{0.9}In_{0.1}N_{0.02}AS_{0.098}$f" and insert --$Ga_{0.9}In_{0.1}N_{0.02}AS_{0.098}$--.

Column 8, Line 40, delete "$n^+Ga_{0.93}In_{0.07}N_{0.91}AS_{0.99}$" and insert --$n^+$-$Ga_{0.93}In_{0.07}N_{0.01}AS_{0.99}$--.

Column 8, Line 51, delete "$n^+$-$Ga_{0.39}In_{0.07}N_{0.01}AS_{0.99}$" and insert --$n^+$-$Ga_{0.93}In_{0.07}N_{0.01}AS_{0.99}$--.

Column 10, Line 26, "$n^+$-$Ga_{0.93}In_{0.07}AS_{0.98}$" and insert --$n^+$-$Ga_{0.93}In_{0.07}N_{0.01}AS_{0.99}$--.

Column 10, line 45, delete "$n^+$-$Ga_{0.93}In_{0.07}N_{0.01}AS_{0.99}$%" and insert --$n^+$-$Ga_{0.93}In_{0.07}N_{0.01}AS_{0.99}$--.

Column 11, line 52, delete "$n^+$-$In_{0.76}Ga_{0.24}AS_{0.51}P$ 0.49" and insert --$n^+$-$In_{0.76}Ga_{0.24}AS_{0.51}P_{0.49}$--.

Column 11, line 59, delete "$p^+$-$Al_{0.27}Ga_{0.20}In_{0.33}AS$" and insert --$p^+$-$Al_{0.27}Ga_{0.20}In_{0.53}AS$--.

Column 12, Line 8, delete "are formed is formed" and insert --are formed--.

Column 12, Line 67, delete "$n^+$-InGaAaP" and insert --$n^+$-InGaAsP--.

Signed and Sealed this

Second Day of November, 2010

David J. Kappos
*Director of the United States Patent and Trademark Office*

Column 13, Line 66, delete "$5 \times 10^9$ cm$^{-3}$" and insert --$5 \times 10^{19}$ cm$^{-3}$--.

Column 14, Line 9, delete "shown in Fig. 45" and insert --shown in Fig. 4B--.

Column 14, lines 49-50, delete "every chip sections are" and insert --every chip section is--.

Column 15, line 19, delete "Figs. 5A and 55" and insert --Figs. 5A and 5B--.

Column 15, line 36, delete "$p^+$-$Al_{0.2}Ga_{0.8}AS_{0.85}Sb_{0.15}$" and insert --$p^+$-$Al_{0.2}Ga_{0.6}AS_{0.85}Sb_{0.15}$--.

Column 15, Line 45, delete "$p^+$-$Al_{0.2}Ga_{0.6}AS_{0.98}$" and insert --$p^+$-$Al_{0.2}Ga_{0.8}AS_{0.98}N_{0.02}$--.

Column 15, Line 47, delete "$n^+Al_{0.2}Ga_{0.7}In_{0.1}AS_{0.98}N_{0.02}$" and insert --$n^+$-$Al_{0.2}Ga_{0.7}In_{0.1}AS_{0.98}N_{0.02}$--.

Column 15, Line 48, delete "$p^+$-$Al_{0.2}Ga_{0.5}AS_{0.85}Sb_{0.15}$" and insert --$p^+$-$Al_{0.2}Ga_{0.8}AS_{0.85}Sb_{0.15}$--.

Column 15, Line 50, delete "$1 \times 10^{20}$ cm$^{-1}$" and insert --$1 \times 10^{20}$ cm$^{-3}$--.

Column 15, Line 64, delete "$p^+$-$Al_{0.02}Ga_{0.8}AS_{0.85}Sb_{0.15}$" and insert --$p^+$-$Al_{0.2}Ga_{0.8}AS_{0.85}Sb_{0.15}$--.

Column 16, Lines 30-31, delete "into such the region" and insert --into such region--.

Column 16, Line 39, delete "an $SiO_3$" and insert --an $SiO_2$--.

Column 16, Line 42, delete "layer 51e" and insert --layer 518--.

Column 17, Line 6, delete "$p^+$-$Al_{0.2}Ga_{0.9}AS_{0.85}Sb_{0.15}$" and insert --$p^+$-$Al_{0.2}Ga_{0.8}AS_{0.85}Sb_{0.15}$--.

Column 17, Line 8, delete "$n^+$-$Al_{0.2}Ga_{0.7}In_{0.1}AS_{0.98}N_{0.02}$" and insert --$n^+$-$Al_{0.2}Ga_{0.7}In_{0.1}AS_{0.96}N_{0.02}$--.

Column 17, Line 34, delete "$Al_{0.2}Ga_{0.7}AS$" and insert --$Al_{0.3}Ga_{0.7}AS$--.

Column 20, Line 5, delete "Japanese Laid open Patent Application" and insert --Japanese Laid Open Patent Application--.